(12) United States Patent
Choi et al.

(10) Patent No.: US 12,178,074 B2
(45) Date of Patent: Dec. 24, 2024

(54) DISPLAY DEVICE INCLUDING GRAPHITE SHEETS PENETRATING MOLD SLOT PORTIONS FOR ENHANCED HEAT DISSIPATION

(71) Applicant: Samsung Display Co., LTD., Yongin-si (KR)

(72) Inventors: Jonghyeon Choi, Pyeongtaek-si (KR); Sungwon Kim, Asan-si (KR); Seokhyun Nam, Seoul (KR); Haengwon Park, Seongnam-si (KR); Il Hyun Yang, Cheonan-si (KR); Daehwan Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 423 days.

(21) Appl. No.: 17/548,305

(22) Filed: Dec. 10, 2021

(65) Prior Publication Data

US 2022/0190279 A1    Jun. 16, 2022

(30) Foreign Application Priority Data

Dec. 14, 2020  (KR) .......................... 10-2020-0174816

(51) Int. Cl.
    *H10K 50/87*    (2023.01)
(52) U.S. Cl.
    CPC .................................. *H10K 50/87* (2023.02)
(58) Field of Classification Search
    CPC ............... H10K 50/87; H10K 50/8794; H05K 7/20954; H05K 7/20963

USPC .......................................................... 257/40
See application file for complete search history.

(56) References Cited

U.S. PATENT DOCUMENTS

| 8,675,363 | B2 * | 3/2014 | Crooijmans .......... G06F 1/1624 |
| | | | 435/303.1 |
| 9,389,029 | B2 * | 7/2016 | Chowdhury ............ F28F 21/06 |
| 10,551,886 | B1 * | 2/2020 | de la Fuente ...... H05K 7/20963 |
| 2015/0301568 | A1 * | 10/2015 | Hill .......................... G06F 1/20 |
| | | | 29/890.03 |
| 2017/0006738 | A1 * | 1/2017 | Lee ..................... H05K 7/20963 |

FOREIGN PATENT DOCUMENTS

KR    10-0546399    1/2006

\* cited by examiner

*Primary Examiner* — Matthew E. Gordon
(74) *Attorney, Agent, or Firm* — Lewis Roca Rothgerber Christie LLP

(57) ABSTRACT

A display device includes a display panel, a mold frame, and graphite sheets. The mold frame includes a mold slot portion therethrough to support the display panel. The graphite sheets include a central portion on a rear surface of the display panel, and end portions passing through the mold slot portion to be on the rear surface of the mold frame. The graphite sheet is rolled and arranged in a mounting space between the display panel and a back cover, such that heat generated from the display panel may be dissipated to the outside via the graphite sheet and the back cover.

20 Claims, 18 Drawing Sheets

(1 of 18 Drawing Sheet(s) Filed in Color)

DISPLAY DEVICE INCLUDING GRAPHITE SHEETS PENETRATING MOLD SLOT PORTIONS FOR ENHANCED HEAT DISSIPATION

CROSS-REFERENCE TO RELATED APPLICATION

This application claims priority to and the benefit of Korean Patent Application No. 10-2020-0174816, filed on Dec. 14, 2020 in the Korean Intellectual Property Office, the entire content of which is herein incorporated by reference.

BACKGROUND

1. Field

Aspects of embodiments of the present invention relate to a display device.

2. Description of the Related Art

In general, in a display device that emits light from the front, a graphite sheet is attached to a rear surface of the display device to diffuse heat generated from the emission layer. The graphite sheet is a thermal spread sheet, and is a product obtained by thermally processing natural graphite to increase thermal conductivity.

The graphite sheet reduces thermal stress by dispersing a concentrated thermal load when driving a pixel in a local area. In other words, the graphite sheet increases the life and efficiency of the display and improves properties such as instantaneous image retention.

SUMMARY

According to an aspect of embodiments of the present invention, a display device having an enhanced heat dissipation function is provided. According to an aspect of embodiments of the present invention, a display device having an enhanced heat dissipation function using a graphite sheet is provided.

According to one or more embodiments of the present invention, a display device includes a display panel, a mold frame, and graphite sheets. The mold frame includes a mold slot portion therethrough to support the display panel. The graphite sheets include a central portion on a rear surface of the display panel, and end portions passing through the mold slot portion to be on the rear surface of the mold frame.

In an embodiment, the display device may further include a cover plate between a rear surface of the graphite sheets and a bottom surface of the mold frame.

In an embodiment, the display device may further include a back cover fastened to the mold frame to receive the graphite sheets and the mold frame.

In an embodiment, the display device may further include a graphite plate on a rear surface of the display panel.

In an embodiment, the graphite plate may be between the display panel and the graphite sheets.

In an embodiment, the graphite plate may be surrounded by the graphite sheets.

In an embodiment, the graphite sheets may include a front portion on the rear surface of the display panel, a curved portion curved at the front portion and penetrating the mold slot portion to be seated in an inner space of the mold frame, and a rear portion extending from the curved portion and arranged parallel to a bottom surface of the mold frame.

In an embodiment, a thickness of the curved portion may be thinner than a thickness of the front portion.

In an embodiment, the display device may further include an inner cushion foam arranged to be surrounded by the curved portion.

In an embodiment, a mold guide may be arranged on an outer wall or an inner wall of the mold frame to guide the graphite sheet.

In an embodiment, a surface of the mold guide may be curved corresponding to the curved portion of the graphite sheets.

In an embodiment, a middle portion and a lower portion of a surface of the mold guide may be recessed relative to an upper portion of the surface of the mold guide such that the curved portion of the graphite sheet is seated.

In an embodiment, a middle portion of a surface of the mold guide may be recessed relative to an upper portion and a lower portion of the surface of the mold guide such that the curved portion of the graphite sheet is seated.

In an embodiment, the display device may further include set components mounted on a lower inner side of the mold frame. Here, the set components may include a power supply (SMPS), an analog-digital (AD) board, and a speaker.

In an embodiment, the graphite sheets may include a first graphite sheet arranged in parallel along a long side of the display panel, and a second graphite sheet arranged in parallel along the long side of the display panel. The mold frame may include a first mold slot penetrating through a side of the first graphite sheet, a second mold slot penetrating through another side of the first graphite sheet, a third mold slot penetrating through a side of the second graphite sheet, and a fourth mold slot penetrating through another side of the second graphite sheet.

In an embodiment, the first graphite sheet and the second graphite sheet may entirely cover the display panel.

In an embodiment, the first graphite sheet and the second graphite sheet may cover half of the display panel.

In an embodiment, the graphite sheets may include a first graphite sheet arranged in parallel along a short side of the display panel, a second graphite sheet arranged in parallel along the short side of the display panel, and a third graphite sheet arranged in parallel along the short side of the display panel. Here, the mold frame may include a first mold slot penetrating through a side of the first graphite sheet, a second mold slot penetrating through another side of the first graphite sheet, a third mold slot penetrating through a side of the second graphite sheet, a fourth mold slot penetrating through another side of the second graphite sheet, a fifth mold slot penetrating through a side of the third graphite sheet, and a sixth mold slot penetrating through another side of the third graphite sheet.

In an embodiment, the graphite sheets may include a first graphite sheet arranged in parallel along a short side of the display panel, and a second graphite sheet arranged in parallel along the short side of the display panel. Here, the mold frame may include a first mold slot penetrating through a side of the first graphite sheet, a second mold slot penetrating through another side of the first graphite sheet, a third mold slot penetrating through a side of the second graphite sheet, and a fourth mold slot penetrating through another side of the second graphite sheet.

In an embodiment, the graphite sheets may be located along a side of the display panel and inserted into the mold slot portion that is parallel to a side of the mold frame.

According to one or more embodiments of the present invention, graphite sheets are rolled and disposed in a mounting space between a display panel and a back cover, such that heat generated from the display panel may be dissipated to the outside via the graphite sheets and the back cover. A front portion of the graphite sheets is disposed on a rear surface of the display panel, a curved portion of the graphite sheets is seated on an outer wall or an inner wall of a mold frame, and a rear portion of the graphite sheets is disposed between the mold frame and the back cover, such that heat generated from the display panel may reach the back cover via the front portion, the curved portion, and the rear portion to be dissipated to the outside.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features and aspects of the present invention will become more apparent by describing in further detail some embodiments thereof with reference to the accompanying drawings, in which.

DETAILED DESCRIPTION

Figure 1:
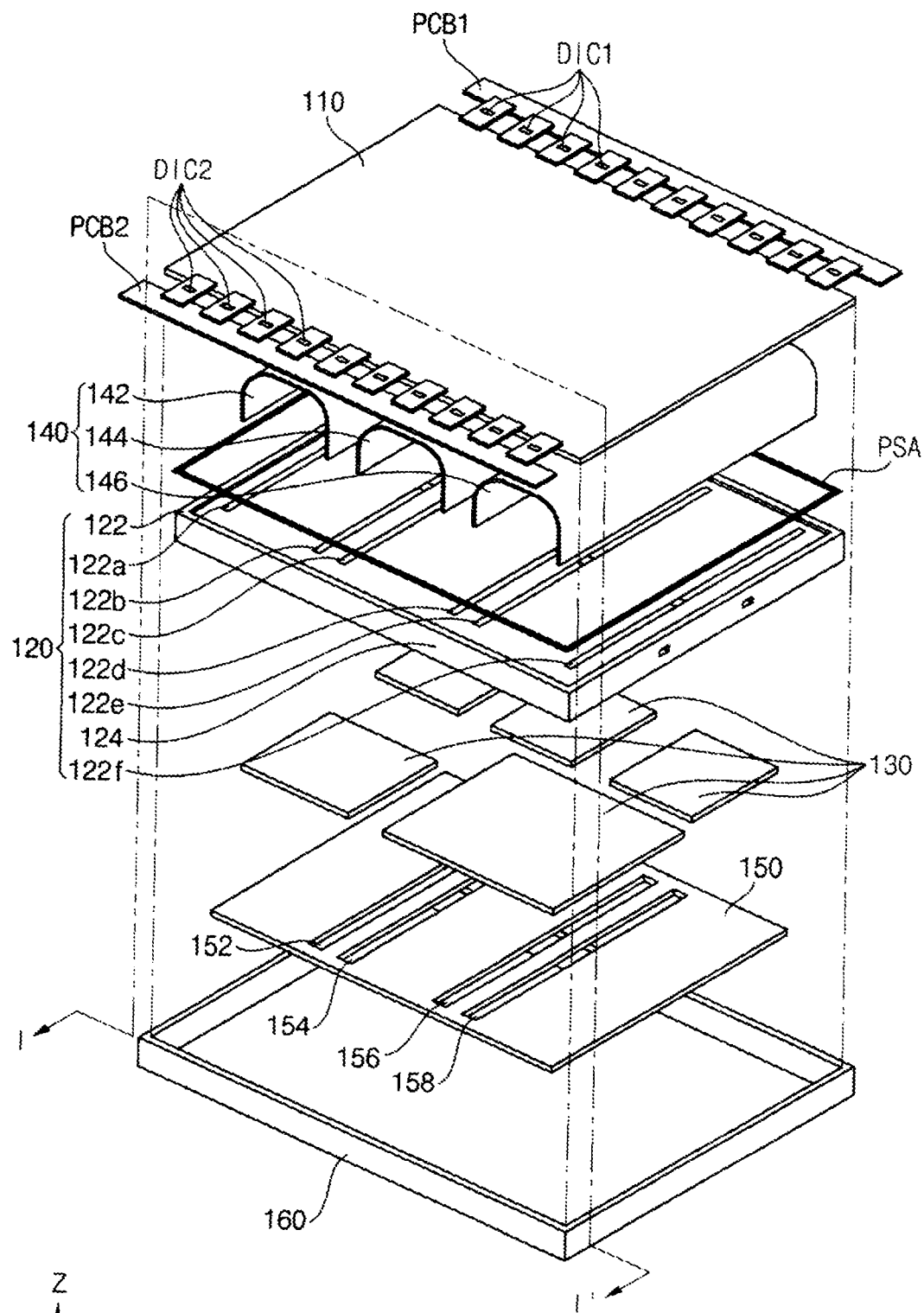
FIG. 1 is an exploded perspective view schematically illustrating a display device according to an embodiment of the present invention.

Herein, a display device according to the present invention will be explained in further detail with reference to the accompanying drawings. Reference will now be made in further detail to embodiments of the invention that are illustrated in the accompanying drawings. Where possible, same or similar reference numerals are used in the drawings and the description to refer to the same or like parts. The drawings are in simplified form and may not be to precise scale. As used herein, the term "and/or" includes any and all combinations of one or more of the associated listed items. Expressions such as "at least one of," when preceding a list of elements, modify the entire list of elements and do not modify the individual elements of the list.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, area, or component is referred to as being "formed on" another layer, area, or component, it may be directly or indirectly formed on the other layer, area, or component. That is, for example, one or more intervening layers, areas, or components may be present.

When an embodiment may be implemented differently, a specific process order may be performed differently from the described order. For example, two consecutively described processes may be performed substantially at the same time or performed in an order opposite to the described order.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
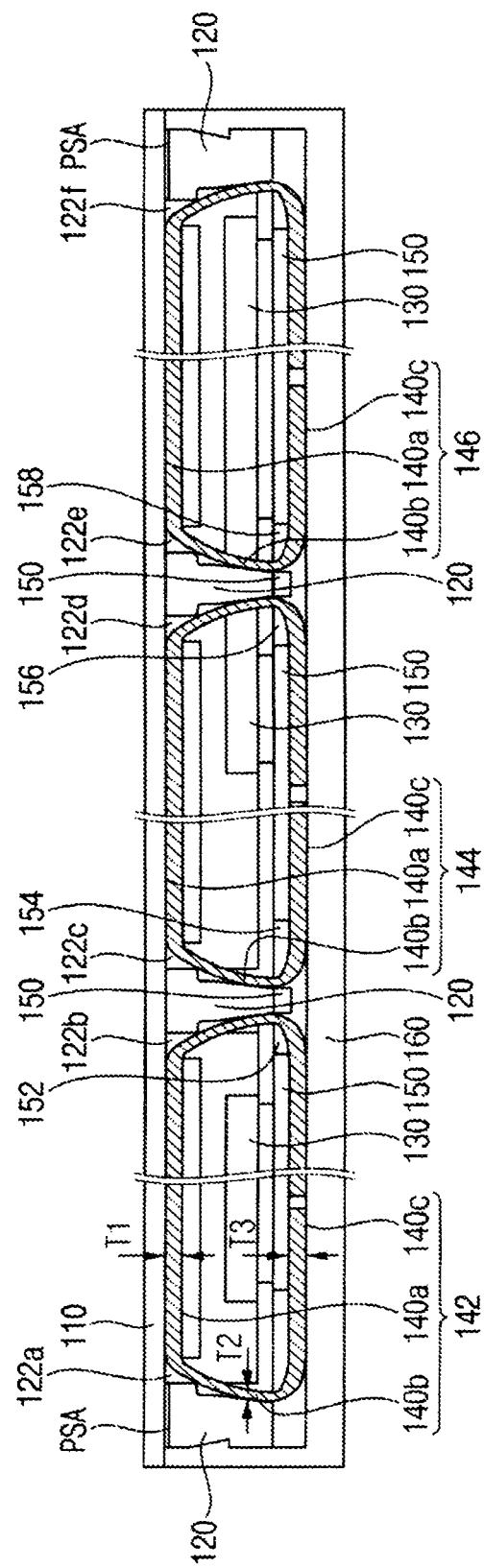
FIG. 2 is a cross-sectional view taken along the line I-I' of FIG. 1.
Figure 3A:
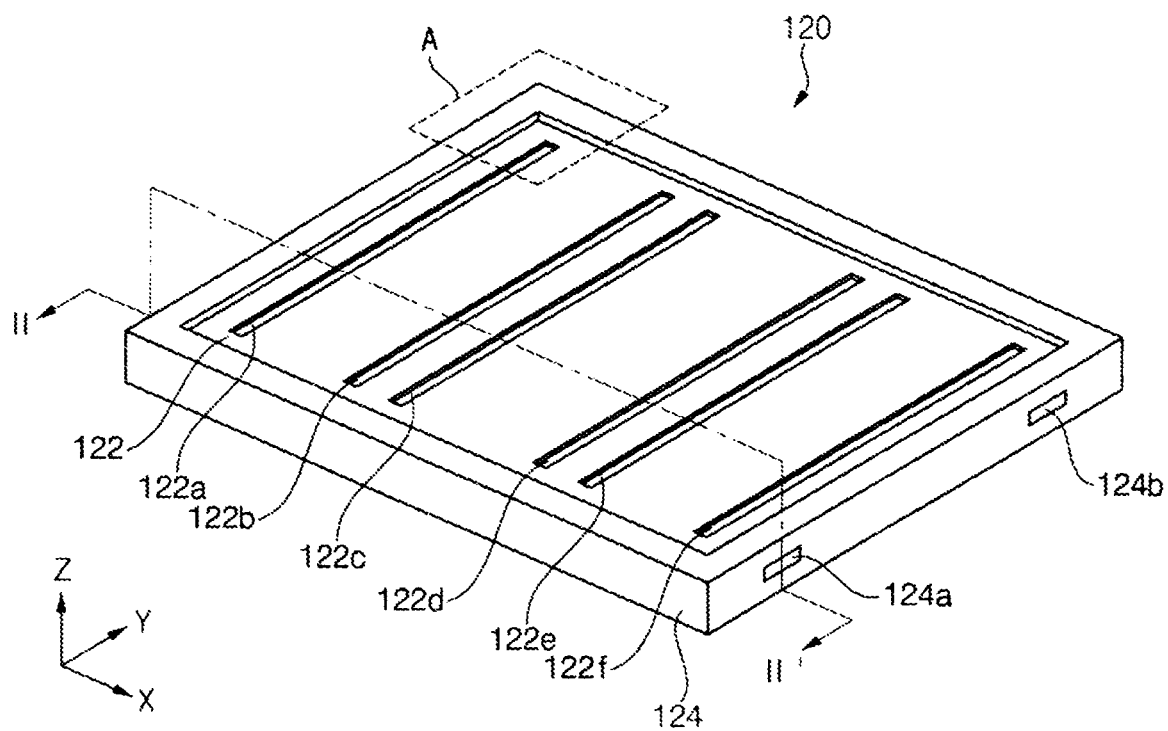
FIG. 3A is a front perspective view illustrating a mold frame shown in FIG. 1.
Figure 3B:
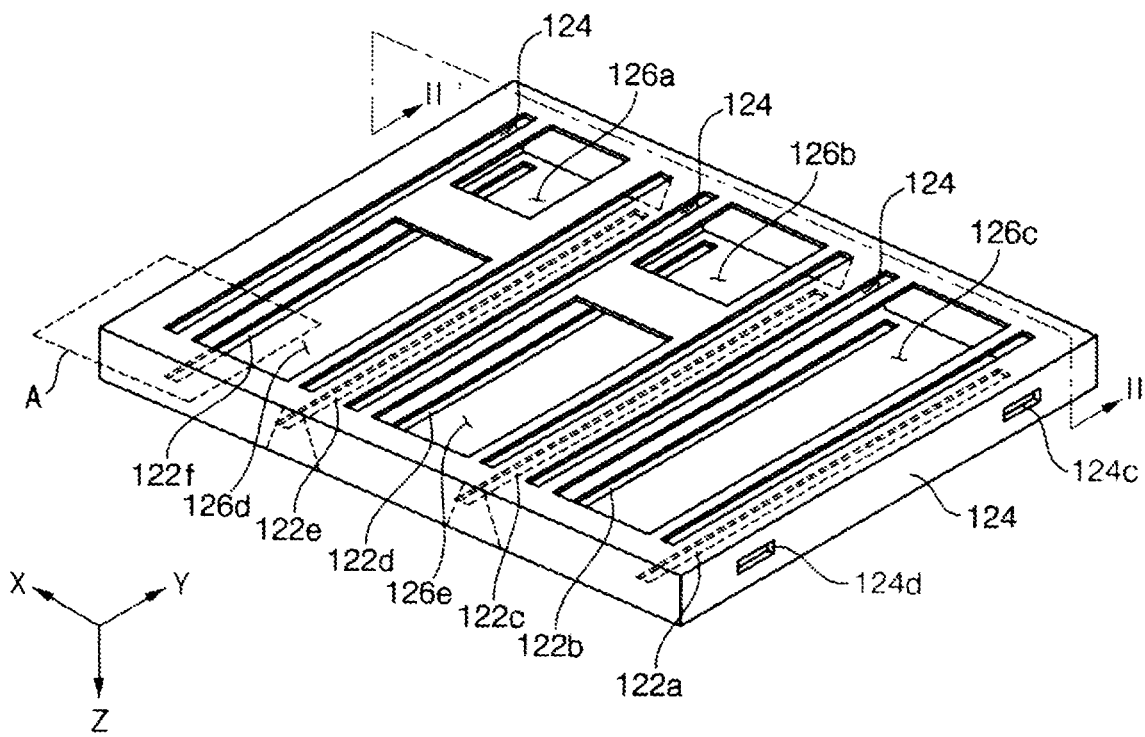
FIG. 3B is a rear perspective view illustrating the mold frame shown in FIG. 1.
Figure 3C:
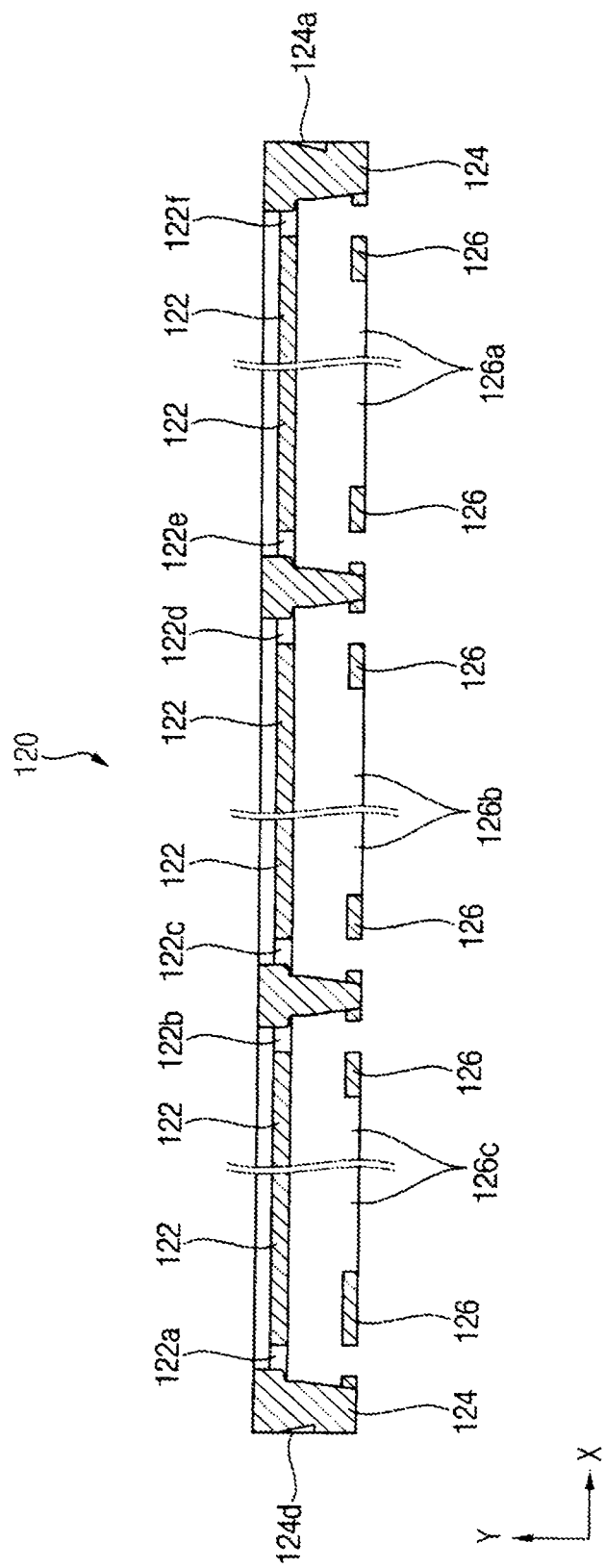
FIG. 3C is a cross-sectional view taken along the line II-II' of the mold frame shown in FIG. 3A.
Figure 3D:
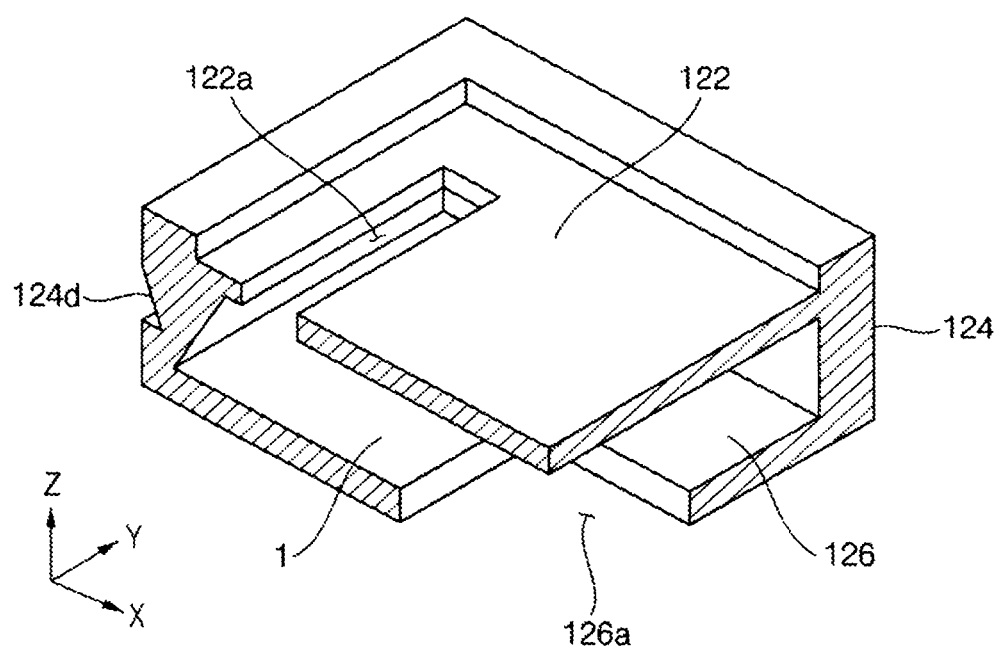
FIG. 3D is an enlarged perspective view of a region "A" of the mold frame shown in FIG. 3A.

FIG. 1 is an exploded perspective view schematically illustrating a display device according to an embodiment of the present invention; and FIG. 2 is a cross-sectional view taken along the line I-I' of FIG. 1. FIG. 3A is a front perspective view illustrating a mold frame shown in FIG. 1; FIG. 3B is a rear perspective view illustrating the mold frame shown in FIG. 1; FIG. 3C is a cross-sectional view taken along the line II-II' of the mold frame shown in FIG. 3A; and FIG. 3D is an enlarged perspective view of a region "A" of the mold frame shown in FIG. 3A.

Referring to FIG. 1, FIG. 2, FIG. 3A, FIG. 3B, FIG. 3C, and FIG. 3D, a display device according to an embodiment of the present invention includes a display panel 110, a mold frame 120, set components 130, and graphite sheets 140.

The display panel 110 is disposed on the mold frame 120. A plurality of display elements is disposed on the display panel 110 to display an image. In FIG. 1, one side of the display panel 110 may be connected to a first printed circuit board PCB1 via a plurality of flexible printed circuit boards (FPCBs) in which a first drive integrated circuit DIC1, and another side of the display panel 110 may be connected to a second printed circuit board PCB2 via a plurality of flexible printed circuit boards (FPCBs) in which a second drive integrated circuit DIC2. The display elements may be any of a liquid crystal display element (LCD element), an electrophoretic display element (EPD element), an electrowetting display element (EWD element), and an organic light-emitting display element (OLED element). An example in which the display panel 110 is an organic light-emitting display panel will be described in FIG. 5 and FIG. 6 below.

In an embodiment, the mold frame 120 has an upper surface 122 defining a rectangular shape having a long side and a short side, a side wall 124 connected to an edge portion of the upper surface 122, and a lower surface 126 defining a rectangular shape having a long side and a short side and being connected to the side wall 124 to form a storage space therein. In an embodiment, the upper surface 122 or the lower surface 126 may be separate from the side wall 124. In an embodiment, a first groove 124a and a second groove 124b for fastening with a back cover to be described later may be formed on one side of the side wall 124, and a third groove 124c and a fourth groove 124d for fastening with the back cover may be formed on another side of the side wall 124.

In an embodiment, mold slot portions are formed parallel to a short side on the upper surface 122. In this embodiment, the mold slot portions include a first mold slot 122a, a second mold slot 122b, a third mold slot 122c, a fourth mold slot 122d, a fifth mold slot 122e, and a sixth mold slot 122f.

The first mold slot 122a has a width (e.g., a predetermined width) to be formed adjacent to a first edge portion of the upper surface 122. The second mold slot 122b and the third mold slot 122c have a width (e.g., a predetermined width) to be formed parallel to each other, and are disposed adjacent to the first mold slot 122a. The fourth mold slot 122d and the fifth mold slot 122e have a width (e.g., a predetermined width) to be formed parallel to each other, and are disposed adjacent to the third mold slot 122c. The sixth mold slot 122f has a width (e.g., a predetermined width) to be formed adjacent to a second edge portion of the upper surface 122.

A plurality of openings formed to expose the set components 130 accommodated in the mold frame 120 to an outside are formed on the lower surface 126. In the present embodiment, the openings include a first opening 126a, a second opening 126b, a third opening 126c, a fourth opening 126d, and a fifth opening 126e. Sizes and positions of the first to fifth openings 126a, 126b, 126c, 126d, and 126e may be varied according to sizes and positions of the set components 130. In the present embodiment, five set components are seated in the mold frame 120, and may contact the graphite sheets 140 through the first to fifth openings 126a, 126b, 126c, 126d, and 126e.

In an embodiment, the set components 130 include a power supply (SMPS), an analog-digital (AD) board, and a speaker to be mounted on a lower inner side of the mold frame 120. In FIG. 1, it is shown that the set components 130 are disposed under the mold frame 120 for convenience of explanation, but the set components 130 may be accommodated inside the mold frame 120. The set components 130 accommodated inside the mold frame 120 are exposed to an outside through the first to fifth openings 126a, 126b, 126c, 126d, and 126e to be exposed to the graphite sheets 140.

The graphite sheets 140 include a front portion 140a, a curved portion 140b, and a rear portion 140c. The graphite sheets 140 may have a uniform thickness or may have different thicknesses. For example, the thickness of the curved portion 140b may be configured to be thinner than the thickness of the front portion 140a or the rear portion 140c for ease of bending. The graphite sheets 140 provide a heat dissipation path such that heat generated from the display panel 110 or heat generated from the set components 130 may be rapidly dissipated to the outside.

In particular, the front portion 140a is disposed between the rear surface of the display panel 110 and the set components 130. The curved portion 140b is curved at the front portion 140a and penetrates the mold slot (e.g., the first mold slot 122a) to be seated on the inner wall of the mold frame 120. The rear portion 140c extends from the curved portion 140b to be disposed parallel to the bottom surface of the mold frame 120. In an embodiment, a pressure sensitive adhesive (PSA) film PSA is attached to a surface of the graphite sheets 140, and the PSA film is peeled off in a process of assembling the display device such that the graphite sheets 140 may be attached to a rear surface of the display panel 110.

In the present embodiment, the graphite sheets 140 include a first graphite sheet 142, a second graphite sheet 144, and a third graphite sheet 146. FIG. 1 shows a state before the first to third graphite sheets 142, 144, and 146 pass through the mold slots 122a, 122b, 122c, 122d, 122e, and 122f; and FIG. 2 shows a state in which the first to the third graphite sheets 142, 144, and 146 are attached to a rear surface of the mold frame 120 after passing through the mold slots 122a, 122b, 122c, 122d, 122e, and 122f.

The first graphite sheet 142 is attached to a rear surface of the display panel 110 and penetrates each of the first and second mold slots 122a and 122b of the mold frame 120 to be disposed on a rear surface of the mold frame 120. The front portion 140a of the first graphite sheet 142 is attached to a rear surface of the display panel 110, the rear portion 140c of the first graphite sheet 142 is disposed on a rear surface of the mold frame 120, and the curved portion 140b of the first graphite sheet 142 is disposed in an inner space of the mold frame 120.

The second graphite sheet 144 is attached to a rear surface of the display panel 110 and penetrates each of the third and fourth mold slots 122c and 122d of the mold frame 120 to be disposed on a rear surface of the mold frame 120. The front portion 140a of the second graphite sheet 144 is attached to a rear surface of the display panel 110, the rear portion 140c of the second graphite sheet 144 is disposed on a rear surface of the mold frame 120, and the curved portion 140b of the second graphite sheet 144 is disposed in an inner space of the mold frame 120.

The third graphite sheet 146 is attached to a rear surface of the display panel 110 and penetrates each of the fifth and sixth mold slots 122e and 122f of the mold frame 120 to be disposed on a rear surface of the mold frame 120. The front portion 140a of the third graphite sheet 146 is attached to a rear surface of the display panel 110, the rear portion 140c of the third graphite sheet 146 is disposed on a rear surface of the mold frame 120, and the curved portion 140b of the third graphite sheet 146 is disposed in an inner space of the mold frame 120.

In an embodiment, the graphite sheets 140 may include a main graphite sheet and a sub-graphite sheet partially overlapped with the main graphite sheet. Here, the main graphite sheet may be formed corresponding to the front portion 140a, the curved portion 140b, and the rear portion 140c, and the sub-graphite sheet may be formed on the curved portion 140b and the rear portion 140c.

In the present embodiment, a mold guide may be formed on an outer wall or an inner wall of the mold frame 120 to guide the graphite sheets 140. Here, the outer wall of the mold frame 120 is a wall corresponding to an outermost area of the mold frame 120, and the inner wall of the mold frame 120 is a wall corresponding to a remaining area of the mold frame 120.

Figure 4A:
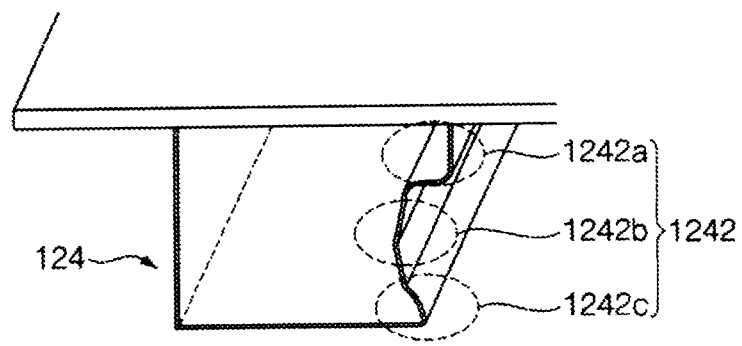
FIG. 4A is a perspective view of a partial area extracted to describe an example of a mold guide formed on a side wall of the mold frame shown in FIG. 1.

FIG. 4A is a perspective view of a partial area extracted to describe an example of a mold guide formed on the side wall 124 of the mold frame 120 shown in FIG. 1.

Referring to FIG. 4A, a first mold guide 1242, which includes an upper portion 1242a protruding toward the curved portion 140b (shown in FIG. 2) of the graphite sheets 140, a middle portion 1242b retracted, or recessed, relative to the upper portion 1242a, and a lower portion 1242c retracted, or recessed, relative to the upper portion 1242a and protruded relative to the middle portion 1242b, is formed on the side wall 124 of the mold frame 120.

In the present example, the middle portion 1242b of the first mold guide 1242 is retracted, or recessed, relative to the upper portion 1242a or the lower portion 1242c, such that the curved portion 140b of the graphite sheets 140 may be seated on the middle portion 1242b.

Figure 4B:
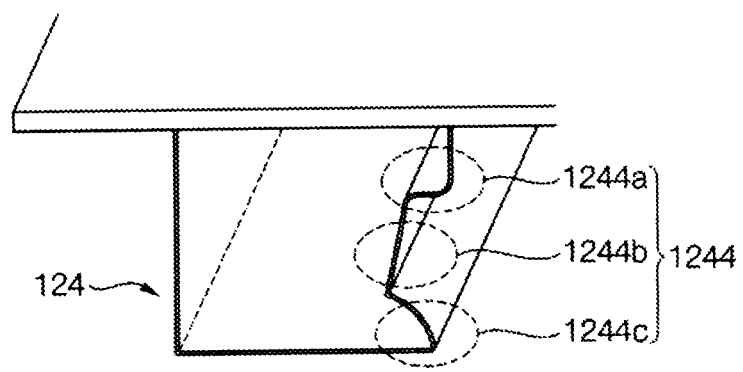
FIG. 4B is a perspective view of a partial area extracted to describe another example of a mold guide formed on a side wall of the mold frame shown in FIG. 1.

FIG. 4B is a perspective view of a partial area extracted to describe another example of a mold guide formed on the side wall 124 of the mold frame 120 shown in FIG. 1.

Referring to FIG. 4B, a second mold guide 1244, which includes an upper portion 1244a protruding toward the curved portion 140b (shown in FIG. 2) of the graphite sheets 140, a middle portion 1244b that retreats, or is recessed, as the distance from the upper portion 1244a increases, and a lower portion 1244c extending from the middle portion 1244b and protruding toward the curved portion 140b of the graphite sheets 140, is formed on the side wall 124 of the mold frame 120. In an embodiment, the middle portion 1244b is gradually retracted, or recessed, downward in the third mold guide 1244. In an embodiment, the lower portion 1244c rapidly protrudes downward in the third mold guide 1244. Accordingly, the curved portion 140b of the graphite sheet 140 may be seated on the middle portion 1244b, and the curved portion 140b of the graphite sheets 140 may be guided firmly by the lower portion 1244c.

Figure 4C:
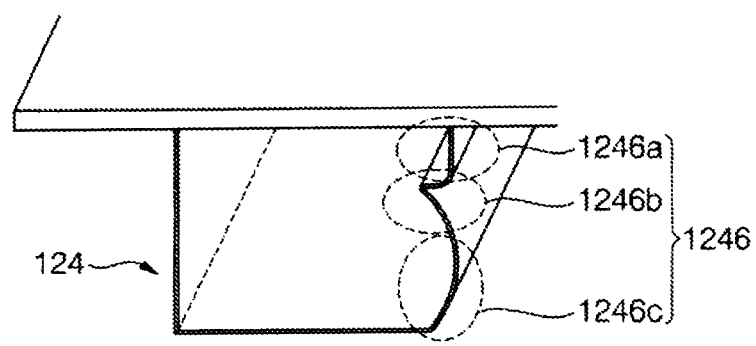
FIG. 4C is a perspective view of a partial area extracted to describe another example of a mold guide formed on a side wall of the mold frame shown in FIG. 1.

FIG. 4C is a perspective view of a partial area extracted to describe another example of a mold guide formed on the side wall 124 of the mold frame 120 shown in FIG. 1.

Referring to FIG. 4C, a third mold guide 1246, which includes an upper portion 1246a protruding toward the curved portion 140b (shown in FIG. 2) of the graphite sheets 140, a middle portion 1246b that is curved and retreated, or recessed, in a shape that rapidly retreats, or is recessed, from the upper portion 1246a, and a lower portion 1246c protruding gradually from the middle portion 1246b by the protrusion of the upper portion 1246a, is formed on the side wall 124 of the mold frame 120. In this example, a cross-section of the third mold guide 1246 has a B-shape or generally a B-shape. Accordingly, the curved portion 140b of the graphite sheets 140 may be seated in the B-shaped curved portion.

The display device according to an embodiment of the present invention may further include a cover plate 150. The cover plate 150 is disposed between a rear surface of the graphite sheets 140 and a bottom surface of the mold frame 120. A wrinkle may be generated in the graphite sheets 140 by openings formed through the bottom surface of the mold frame 120.

Accordingly, by disposing the cover plate 150 between the graphite sheets 140 and the mold frame 120, a surface on which the graphite sheets 140 are seated may be flattened. Therefore, it is possible to prevent or substantially prevent a wrinkle of the graphite sheets 140 from being generated.

In the present embodiment, a first cover slot 152, a second cover slot 154, a third cover slot 156, and a fourth cover slot 158 are formed through the cover plate 150. A rear surface portion 140c of a side of the first graphite sheet 142 passing through the first cover slot 152 is seated on a rear surface of the cover plate 150. A rear surface portion of a side of the second graphite sheet 144 passing through the second cover slot 154 is seated on the rear surface of the cover plate 150, and a rear surface portion of the other side of the second graphite sheet 144 passing through the third cover slot 156 is seated on the rear surface of the cover plate 150. A rear surface portion of a side of the third graphite sheet 146 passing through the fourth cover slot 158 is seated on the rear surface of the cover plate 150.

The display device according to an embodiment of the present invention may further include a back cover 160 that is fastened to the mold frame 120 to receive the graphite sheets 140, the set components 130, and the mold frame 120.

Figure 5:
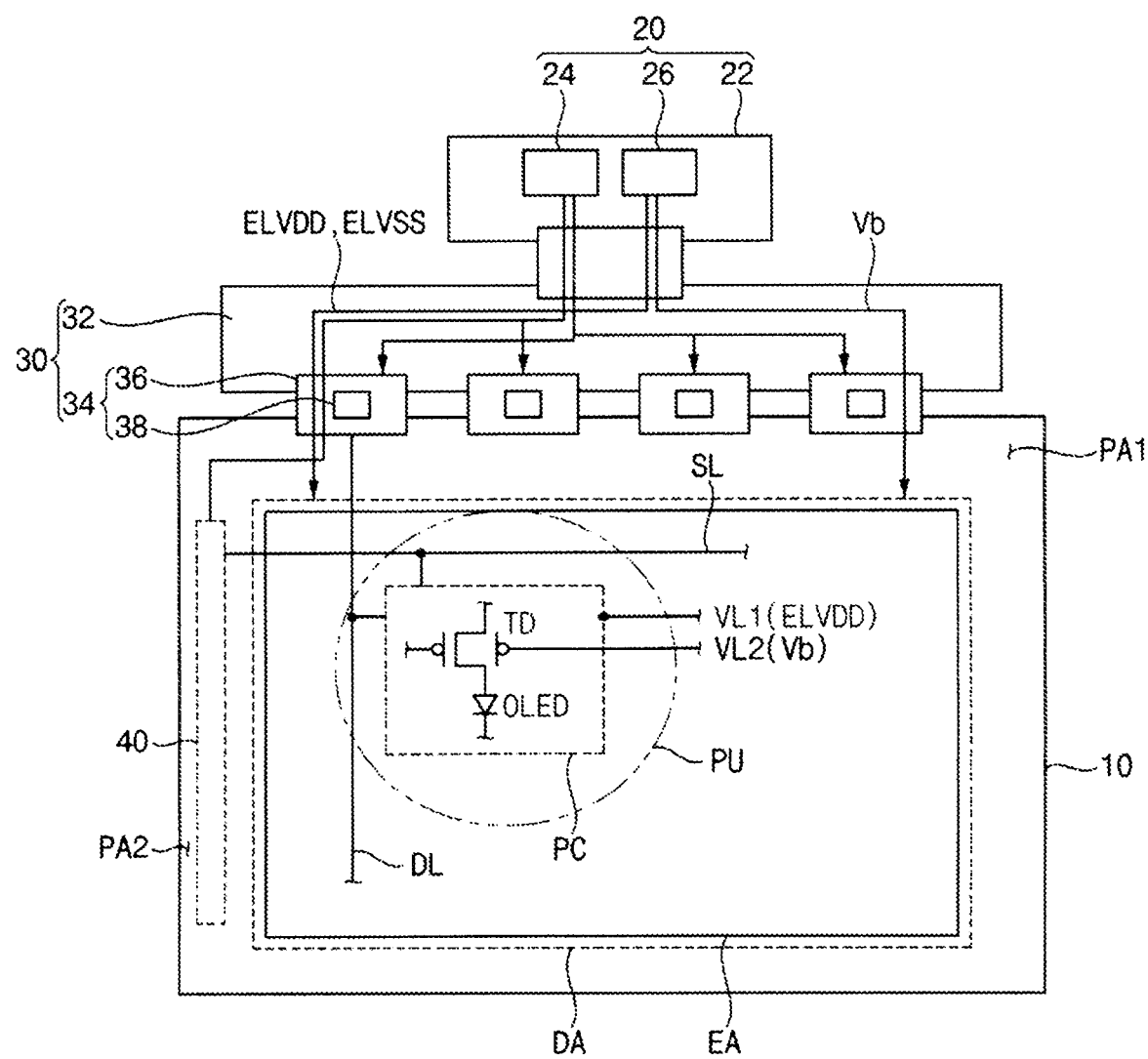
FIG. 5 is a block diagram illustrating an organic light-emitting display device according to an example of the display device illustrated in FIG. 1.

FIG. 5 is a block diagram illustrating an organic light-emitting display device according to an example of the display device illustrated in FIG. 1.

Referring to FIG. 5, the organic light-emitting display device includes a display panel 10, a main driving circuit 20, a source driving circuit 30, and a scan driving circuit 40.

The display panel 10 includes a display area DA and a peripheral area including a plurality of peripheral areas surrounding the display area DA.

The display area DA includes a plurality of data lines DL, a plurality of scan lines SL, a plurality of voltage lines VL1 and VL2, and a plurality of pixel units PU. The data lines DL are connected to the source driving circuit 30 to provide a plurality of data voltages to the plurality of pixel units PU.

The plurality of scan lines SL is connected to the scan driving circuit 40 to provide a plurality of scan signals to the pixel units PU.

The first voltage line VL1 provides a first light-emitting power voltage ELVDD to the pixel units PU.

The second voltage line VL2 provides an independent bias voltage Vb to the pixel units PU.

The pixel unit PU includes a data line DL, a scan line SL, and a pixel circuit PC connected to the first and second voltage lines VL1 and VL2.

In an embodiment, the pixel circuit PC includes an organic light-emitting diode OLED, a plurality of transistors driving the organic light-emitting diode OLED, and at least one capacitor.

The plurality of transistors includes a driving transistor TD connected to an anode electrode of the organic light-emitting diode OLED and applying a driving current corresponding to a data voltage to the anode electrode of the organic light-emitting diode OLED.

In an embodiment, the main driving circuit 20 includes a timing control part 24 and a voltage generator 26 mounted on a main printed circuit board 22. The timing control part 24 receives an image signal and a control signal from an external device (not shown). In an embodiment, the image signal may include red, green, and blue data.

The control signal may include a horizontal synchronization signal, a vertical synchronization signal, a main clock signal, and the like.

The timing control part 24 outputs image data converted from the image signal according to specifications such as a pixel structure, resolution, and the line of the display area DA.

The timing control part 24 may generate a first control signal for driving the source driving circuit 30 and a second control signal for driving the scan driving circuit 40 based on the control signal.

The voltage generator 26 generates a plurality of driving voltages. The driving voltages include a source driving voltage provided to the source driving circuit 30, a scan driving voltage provided to the scan driving circuit 40, and a panel driving voltage provided to the display panel 10.

The panel driving voltage includes a first light-emitting power voltage ELVDD, a second light-emitting power voltage ELVSS, and an independent bias voltage Vb provided to the pixel circuit PC.

The first light-emitting power voltage ELVDD is applied to the anode electrode side of the organic light-emitting diode OLED, and the second light-emitting power voltage ELVSS is applied to a cathode electrode E2 of the organic light-emitting diode OLED.

The independent bias voltage Vb is applied to an independent terminal of the driving transistor TD. In an embodiment, the independent bias voltage Vb may have about −7 V to 6 V.

The source driving circuit 30 includes a plurality of source driving films 34 mounted on a source printed circuit board 32. The source driving film 34 includes a flexible circuit film 36 on which a driving chip 38 is mounted.

The source driving circuit 30 is connected to a first peripheral area PA1 of the display panel 10. The source driving circuit 30 converts an image data provided from the timing controller 24 into a data voltage using a gamma voltage, and provides the data voltage to the data line DL. The first emission power voltage ELVDD, the second emission power voltage ELVSS and the independent bias voltage Vb may be provided on the display panel 10 through a source driving film disposed outside of the source driving films 34. The scan driving circuit 40 is disposed in the second peripheral area PA2 of the display panel 10.

The scan driving circuit 40 may include a plurality of transistors directly formed in a second peripheral area PA2 in a same process as a manufacturing process of forming a transistor included in the pixel circuit PC.

The scan driving circuit 40 generates a plurality of scan signals based on a control signal provided from the timing controller 24 and provides the scan signals to the plurality of scan lines SL.

Figure 6:
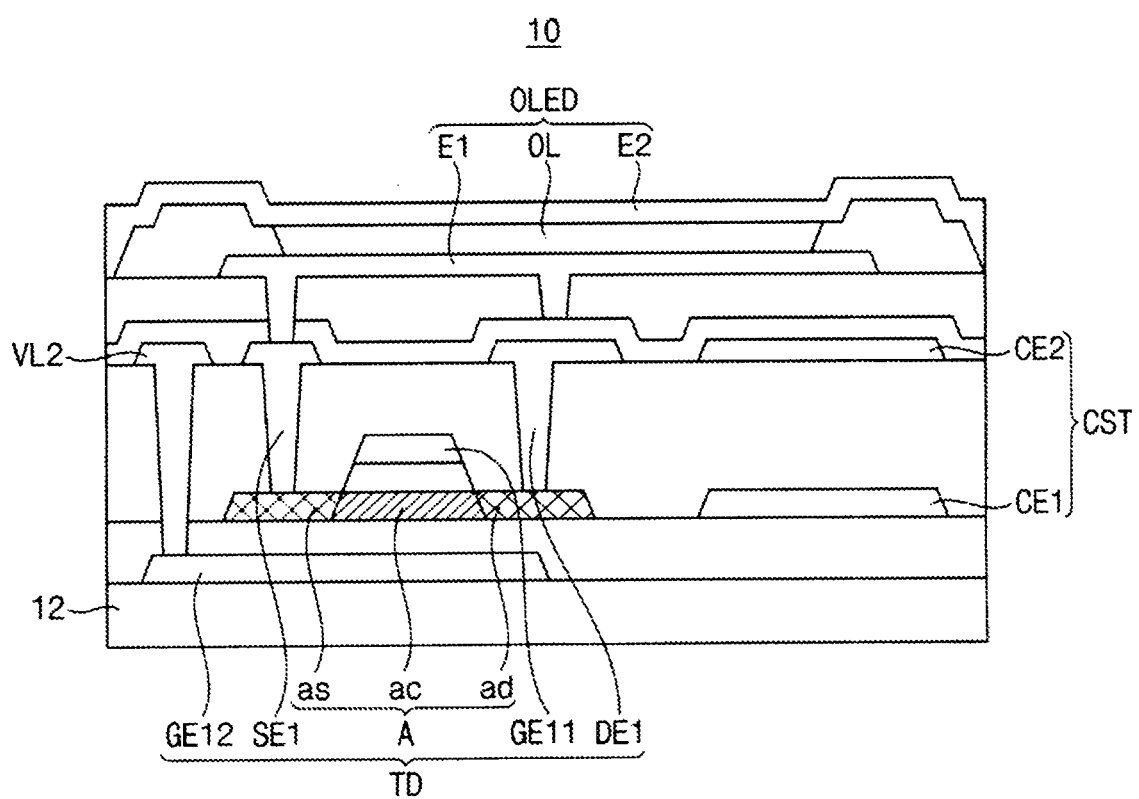
FIG. 6 is a cross-sectional view schematically illustrating a display panel shown in FIG. 5.

FIG. 6 is a cross-sectional view schematically illustrating a display panel shown in FIG. 5;

Referring to FIG. 5 and FIG. 6, the display panel 10 includes a base substrate 12, the driving transistor TD, a second voltage line VL2, a storage capacitor CST and the organic light-emitting diode OLED.

The base substrate 12 may be an insulation substrate including glass, a polymer, stainless steel, or the like.

The driving transistor TD is disposed on the base substrate 12. The driving transistor TD includes an active pattern A, a first gate electrode GE11, a source electrode SE1, a drain electrode DE1 and a second gate electrode GE12.

The active pattern A includes a source area "as," a channel area "ac," and a drain area "ad."

A channel of the driving transistor TD may be defined by the channel area "ac."

The first gate electrode GE11 is disposed on the channel area "ac." The source electrode SE1 may be connected to the source area "as" through a first contact hole formed in an insulation layer, and the drain electrode DE1 may be connected to the drain area "ad" through a second contact hole formed in the insulation layer. The second gate electrode GE12 overlaps the active pattern A to be disposed under the active pattern A.

The second voltage line VL2 is connected to the second gate electrode GE2 of the driving transistor TD through a third contact hole formed in an insulation layer. An independent bias voltage Vb may be applied to the second voltage line VL2, and the independent bias voltage Vb may be applied to the second gate electrode GE2.

A threshold voltage, a sub-threshold voltage slope, and a mobility of the driving transistor TD may change according to a voltage level of the independent bias voltage Vb.

The capacitor CST may include a first electrode CE1, a second electrode CE2 overlapping the first electrode CE1, and an insulation layer interposed between the first and second electrodes CE1 and CE2. For example, the first electrode CE1 may be formed of a same metal layer as the first gate electrode GE11, and the second electrode CE2 may be formed of a same metal layer as the source and drain electrodes SE1 and DE1.

The organic light-emitting diode OLED includes an anode electrode E1, an organic emission layer OL and the cathode electrode E2. For example, the anode electrode E1 may be connected to the drain electrode DE1 of the driving transistor TD through a fourth contact hole. At least one of the anode electrode E1 and the cathode electrode E2 may be any of a transmissive electrode, a reflective electrode, and a semi-transmissive electrode. Light generated from the organic emission layer OL may be emitted toward the anode electrode E1 or the cathode electrode E2 formed as a transparent electrode.

A simulation experiment was performed to confirm the heat distribution by the graphite sheet. That is, a partial area of the graphite sheet is in full contact with one surface of the heat source, and the remaining area of the graphite sheet is disposed away from the heat source to perform a simulation experiment. When the graphite sheet is attached to a heat source, such as a display panel including a light-emitting layer that generates heat, heat diffusion proceeds rapidly. It was found through the simulation experiment that the surface temperature of the graphite sheet far from the heat source was reduced by about 2.44 degrees Celsius compared to the heat source. As such, graphite has excellent heat diffusion ability. In graphite, temperature decrease occurs due to surface heat radiation and convection. A heat transfer amount "$q_x$" by surface heat radiation is calculated by the following Equation 1, and a heat transfer amount "$q_{conv}$" by convection is calculated by the following Equation 2.

$$q_x = -kA\frac{dT}{dx} = -kA\frac{d}{dx}\left((T_2 - T_1)\frac{x}{L} + T_1\right) = -kA\left(\frac{T_2 - T_1}{L}\right) \quad \text{[Equation 1]}$$

where, k is the heat transfer coefficient, A is the heat transfer area, and L is the thickness of the object.

$$q_{conv} = hA(T_s - T_\infty) \quad \text{[Equation 2]}$$

where, $T_s$ is the temperature of the back cover, $T_\infty$ is the air temperature, h is the convection coefficient, and A is the surface area.

According to the present invention, the curved portion 140b and the rear portion 140c of the graphite sheets 140 penetrate outside the uniform heat source to generate a temperature gradient (T2−T1) inside the graphite. The ambient temperature Ts is increased at the surface of the back cover in contact with the graphite sheet, and a temperature gradient with the ambient temperature is generated. Accordingly, the heat transfer amount $q_{conv}$ of convection increases, such that the temperature at the surface of the display panel may be reduced. According to the same principle, radiant heat may be reduced at a surface of the display panel.

Figure 7:
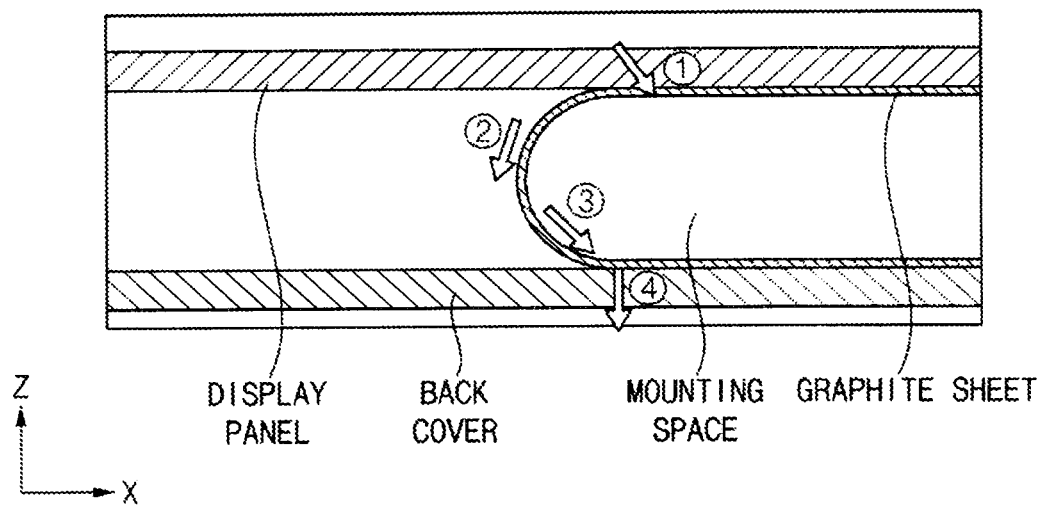
FIG. 7 is a cross-sectional view illustrating a heat path of a display device according to the present invention.
Figure 8:
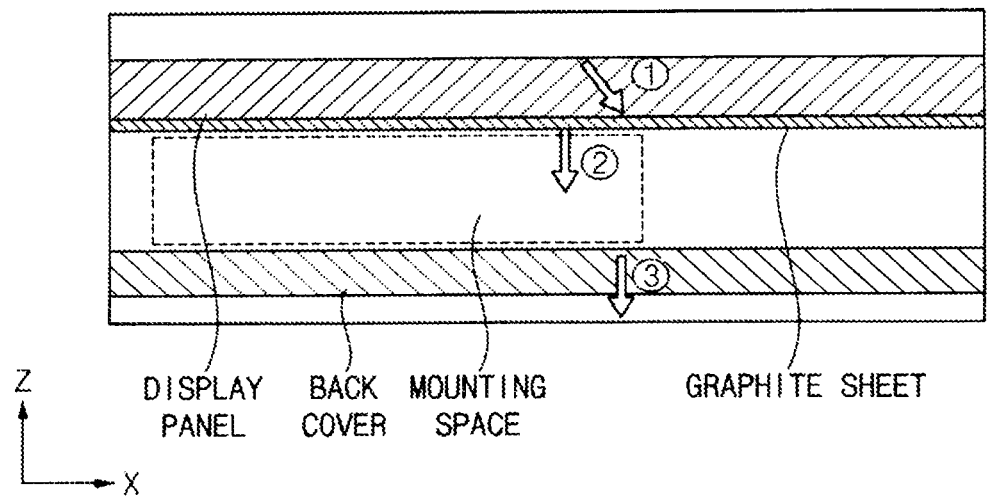
FIG. 8 is a cross-sectional view illustrating a heat path of a display device according to a comparative example.

FIG. 7 is a cross-sectional view illustrating a heat path of a display device according to the present invention. FIG. 8 is a cross-sectional view illustrating a heat path of a display device according to a comparative example. In FIG. 7 and FIG. 8, a cross-sectional view of Computer Aided Engineering (CAE) modeling a simplified complex structure of a display device is shown in order to check an effect by comparing a surface temperature.

As shown in FIG. 7, in a structure according to the present invention, a graphite sheet is rolled and disposed in a mounting space between a display panel and a back cover. In the structure according to the present invention, the graphite sheet is attached to the rear surface of the display panel, and the graphite sheet is curved and then attached to the back cover.

According to the present invention, heat generated from a display panel are transferred to an outside through a graphite sheet and a back cover attached to a rear surface of the display panel. In the graphite sheet, the heat is transferred to the back cover via the front portion, the curved portion, and the rear portion.

As shown in FIG. 8, in a conventional structure, a graphite sheet is disposed in a mounting space between a display panel and a back cover, and the graphite sheet is attached only to the rear surface of the display panel.

According to the comparative example, heat generated from the display panel is transferred to an outside through a graphite sheet, an air layer, and a back cover attached to a rear surface of the display panel. In this case, since the graphite sheet is only attached to the rear surface of the display panel, heat is transferred to the back cover via an air layer. However, in the structure according to the comparative example, heat is hardly transferred to the back cover due to a heat insulation effect of the air gap, which is a mounting space, and, thus, heat cannot be transferred effectively from the back cover to the outside.

In the conventional structure, under full pixel driving conditions, the heat source is very uniform, such that there is almost no temperature gradient. Thus, no heat is transferred. In the conventional structure, the reason for attaching graphite is to lower heat in the peak box (e.g., partial pixel drive). In the set condition of the conventional structure, heat is hardly transferred to the back cover due to the heat insulation effect of the air gap (e.g., Ts is low), and, thus, heat cannot be transferred effectively from the back cover to the outside.

Table 1 illustrates a temperature reduction effect between a structure of the present invention shown in FIG. 7 and a conventional structure shown in FIG. 8.

TABLE 1

| | Effect Panel surface temperature | Simulation conditions | | | | |
| --- | --- | --- | --- | --- | --- | --- |
| | | Thermal conductivity of graphite Thickness | Convection coefficient of cover | Convection coefficient of graphite | Emissivity of cover | Emissivity of graphite |
| Conventional structure | 54.25° C. | 1500 W/(mK) 0.2 T | 0 | 0.5 W/m²K | 0 | 0.2 |
| Invention Structure | 38.8~48.9° C. | | 5 W/m²K | 0 | 0.7 | 0 |

In a conventional structure, an amount of heat transferred between a back cover and a display panel is very small. Convection or heat radiation does not occur on a surface of graphite trapped by structures such as a back cover.

The panel surface temperature according to a conventional structure was observed at about 54.25 degrees Celsius. In contrast, a panel surface temperature according to the present invention was observed from about 38.8 degrees Celsius to about 48.9 degrees Celsius.

Therefore, compared to the conventional structure, the structure according to the present invention has an effect of reducing about 5 degrees Celsius to about 15 degrees Celsius.

Figure 9:
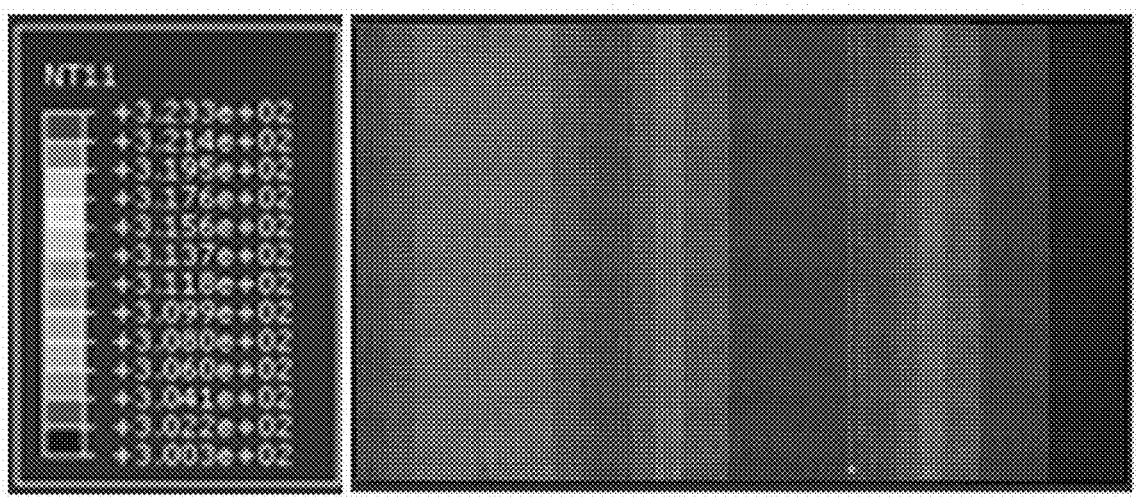
FIG. 9 is an image illustrating a temperature distribution of a structure according to the present invention shown in FIG. 7.
Figure 10:
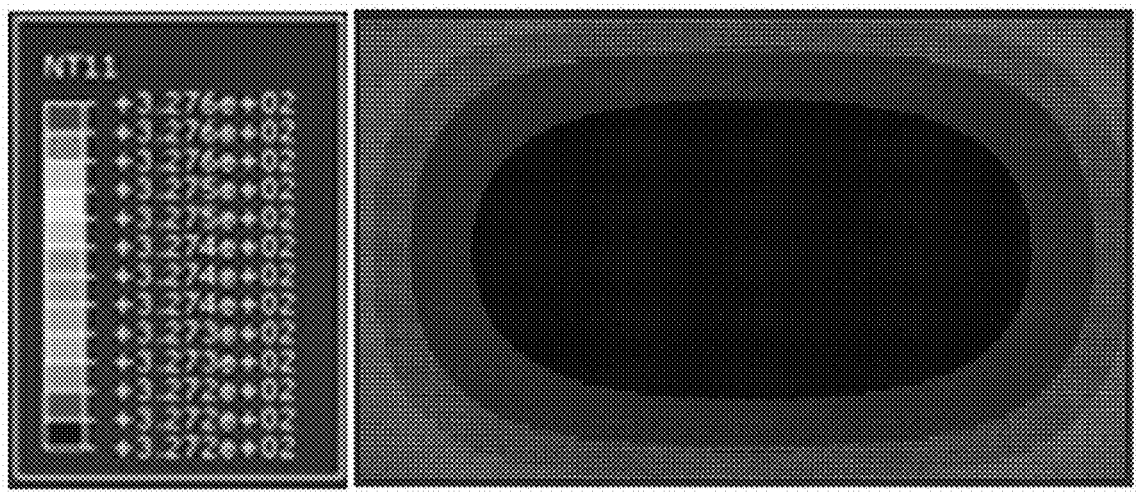
FIG. 10 is an image illustrating a temperature distribution of a structure according to the comparative example shown in FIG. 8.

FIG. 9 is an image illustrating a temperature distribution of a structure according to the present invention shown in FIG. 7. FIG. 10 is an image illustrating a temperature distribution of a structure according to the comparative example shown in FIG. 8

Referring to FIG. 9, it may be seen that high heats are measured in the vertical direction from the viewpoint of the observer. The high heats being measured mean that heats are dissipated to an outside. Therefore, it may be recognized that the structure according to the present invention has a high heat-dissipating effect.

By contrast, referring to FIG. 10, it may be recognized that the heats measured in the structure according to the comparative example are not high. It may be recognized that heats are not smoothly dissipated to an outside in the structure according to the comparative example.

Figure 11:
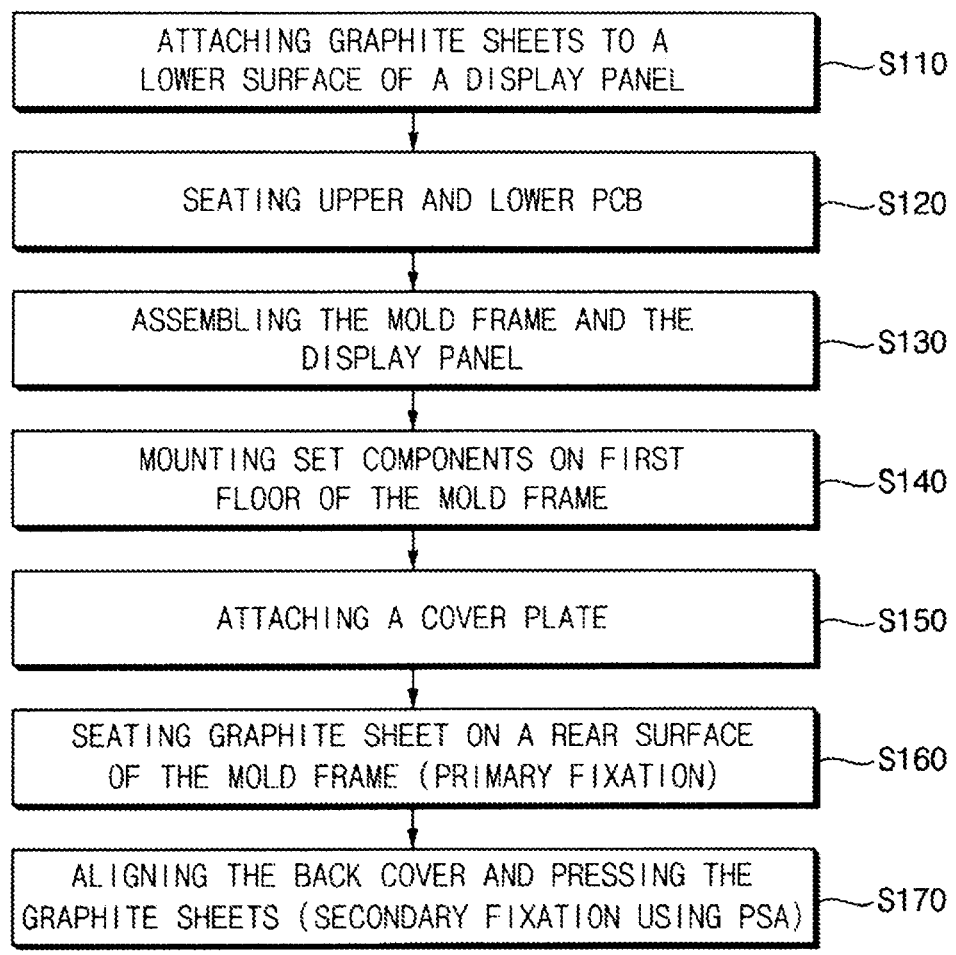
FIG. 11 is a flowchart illustrating assembly of the display device shown in FIG. 1, according to an embodiment of the present invention.

FIG. 11 is a flowchart illustrating assembly of the display device shown in FIG. 1, according to an embodiment of the present invention.

Referring to FIG. 1 and FIG. 11, the graphite sheets 140 are attached to a lower surface (e.g., a rear surface) of the display panel 110 (S110). At this time, a release film is attached to a surface of the graphite sheets 140. The release film is removed from the lower surface of the display panel 110, and the release film is not removed from the remaining portion of the display panel 110.

Then, an upper/lower PCB is seated in the mold frame 120 (S120).

Then, the mold frame 120 and the display panel 110 are assembled (S130). For example, after attaching a foam tape, such as double-sided tape, to an edge of the display panel 110 or an edge of the mold frame 120, the mold frame 120 and the display panel 110 are assembled. In this case, the foam tape may serve to fix the mold frame 120 and the display panel 110.

Then, set components are mounted on a first floor of the mold frame 120 (S140). In the present embodiment, the mold frame 120 includes an upper surface, a sidewall, and a lower surface. Here, a storage space is formed between the upper surface and the lower surface. A bottom surface of the storage space is defined as the first floor of the mold frame 120.

Then, the cover plate 150 is attached to cover the rear surface of the mold frame 120 (S150). Here, the cover plate 150 may be disposed between the graphite sheets 140 and the mold frame 120 to flatten a surface on which the graphite sheets 140 are mounted. Therefore, it is possible to prevent or substantially prevent a wrinkle of the graphite sheets 140 from being generated.

Then, after passing the remaining portion of the graphite sheets 140 attached to the rear surface of the display panel 110 through a slot formed in the mold frame 120, the graphite sheets 140 are seated on the rear surface of the mold frame 120 such that the graphite sheets 140 are first secured (S160). In the present embodiment, since the cover plate 150 is attached to the rear surface of the mold frame 120, the remaining portion of the graphite sheets 140 is first fixed to the rear surface of the cover plate 150.

Then, in an embodiment, after aligning the back cover 160 and pressing the graphite sheets 140, the graphite sheets 140 are secondarily fixed using a separate PSA film (S170). In an embodiment, a side hook is formed on an inner wall of the back cover 160, and a hook groove is formed on an outer wall 124 of the mold frame 120. Accordingly, the back cover 160 may be fastened to the mold frame 120 in a hook manner.

In an embodiment, the PSA film attached to secondarily fix the graphite sheets 140 may be removed when delivered to a set assembly company. Further, in an embodiment, the PSA film attached to secondary fix the graphite sheets 140 may not be removed for formal fixation.

Figure 12:
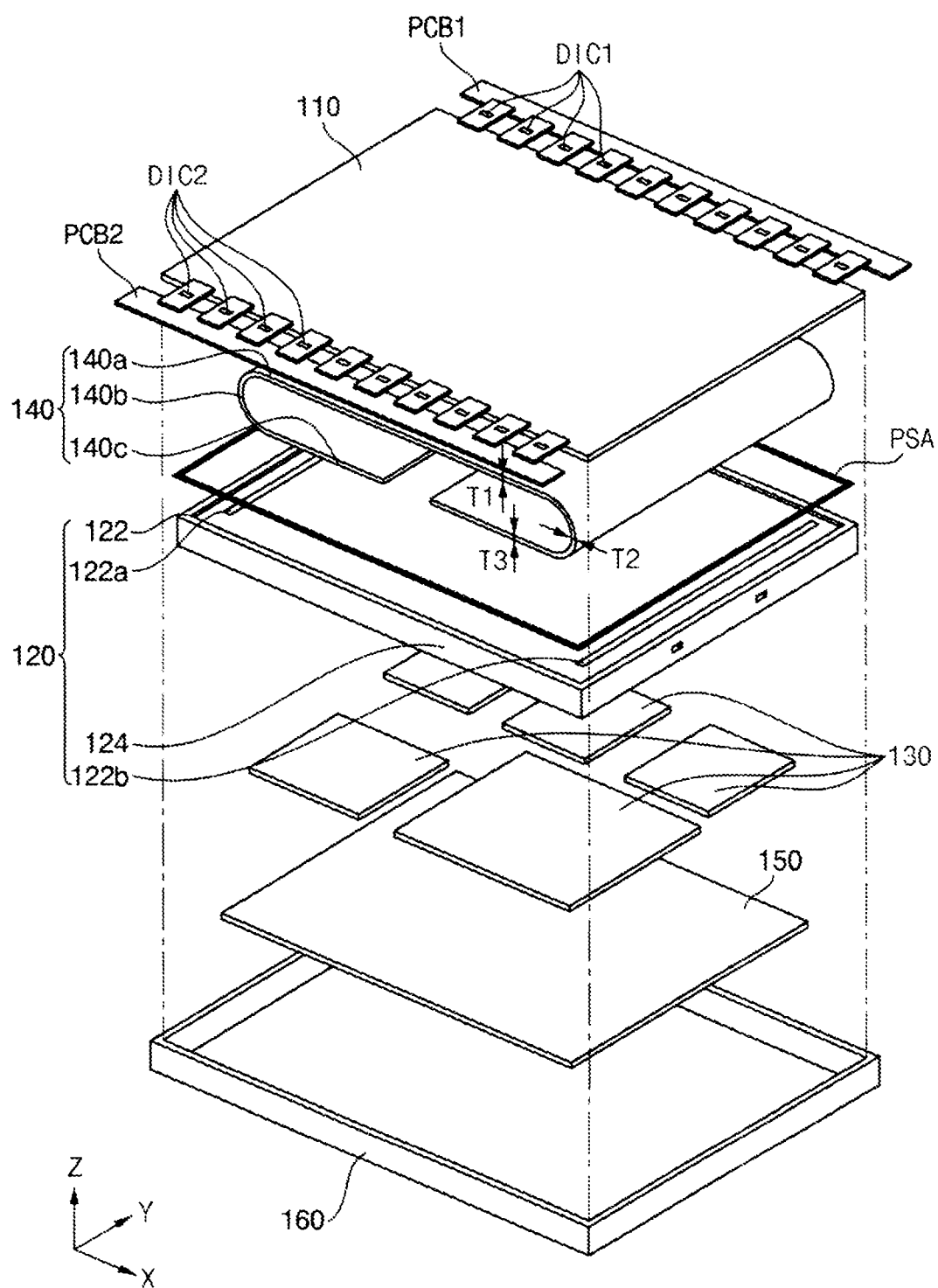
FIG. 12 is an exploded perspective view schematically illustrating a display device according to another embodiment of the present invention.

FIG. 12 is an exploded perspective view schematically illustrating a display device according to another embodiment of the present invention.

Referring to FIG. 12, a display device according to another embodiment of the present invention includes a display panel 110, a mold frame 120, a set component 130, a graphite sheet 140, a cover plate 150, and a back cover 160.

The display panel 110 is disposed on the mold frame 120. A plurality of display elements is disposed on the display panel 110 to display an image. In FIG. 12, one side of the display panel 110 may be connected to a first printed circuit board PCB1 via a plurality of flexible printed circuit boards (FPCBs) in which a first drive integrated circuit DIC1, and another side of the display panel 110 may be connected to a second printed circuit board PCB2 via a plurality of flexible printed circuit boards (FPCBs) in which a second drive integrated circuit DIC2.

The mold frame 120 has an upper surface 122 defining a rectangular shape having a long side and a short side, a side wall 124 connected to an edge portion of the upper surface 122, and a lower surface 126 defining a rectangular shape having a long side and a short side and being connected to the side wall 124 to from a storage space therein. In an embodiment, the upper surface 122 or the lower surface 126 may be separate from the side wall 124.

The first mold slot 122*a* and the second mold slot 122*b* are formed on the upper surface 122 parallel to a short side. The first mold slot 122*a* has a width (e.g., a predetermined width) and is formed adjacent to an edge portion of the upper surface 122. The second mold slot 122*b* has a width (e.g., a predetermined width) and is formed adjacent to another edge portion of the upper surface 122.

The lower surface 126 includes a plurality of openings formed to expose the set components 130 accommodated in the mold frame 120 to an outside. Sizes and positions of the openings may vary according to sizes and positions of the set components 130 accommodated in the mold frame 120.

In an embodiment, the set components 130 include a power supply device (SMPS), an analog-digital (AD) board, and a speaker, and are mounted on the lower inner side of the mold frame 120. In FIG. 12, it is shown that the set components 130 are disposed under the mold frame 120 for convenience of description. However, the set components 130 may be accommodated inside the mold frame 120. The set components 130 accommodated inside the mold frame 120 may be exposed to an outside through the openings.

The graphite sheets 140 include a front portion 140*a*, a curved portion 140*b*, and a rear portion 140*c*. The graphite sheets 140 may have a uniform thickness or may have different thicknesses. For example, the thickness of the curved portion 140*b* may be configured to be thinner than the thickness of the front portion 140*a* or the rear portion 140*c* for ease of bending. The graphite sheets 140 provide a heat dissipation path such that heat generated from the display panel 110 or heat generated from the set components 130 may be rapidly dissipated to the outside.

The front portion 140*a* is attached to a rear surface of the display panel 110 to be disposed on the set components 130. The curved portion 140*b* is curved at the front portion 140*a* and penetrates the mold slot to be seated on an inner wall of the mold frame 120. The rear portion 140*c* extends from the curved portion 140*b* to be disposed parallel to a bottom surface of the mold frame 120. In an embodiment, a pressure sensitive adhesive (PSA) film is attached to a surface of the graphite sheets 140. The PSA film is peeled off in a process of assembling a display device such that the graphite sheets 140 may be attached to a rear surface of the display panel 110.

In the present embodiment, the graphite sheets 140 include a first graphite sheet 142. The first graphite sheet 142 is attached to a rear surface of the display panel 110 and penetrates each of the first and second mold slots 122a and 122b of the mold frame 120 to be disposed on a back surface of the display panel 110. The front portion of the first graphite sheet 142 is attached to the rear surface of the display panel 110, the rear portion of the first graphite sheet 142 is disposed on the rear surface of the mold frame 120, and the curved portion of the first graphite sheet 142 is disposed in the inner space of the mold frame 120.

In the present embodiment, a mold guide may be formed on an outer wall of the mold frame 120 to guide the graphite sheets 140. Since the above-described mold guide has been described with respect to previous embodiments, further detailed description thereof will be omitted.

By disposing the cover plate 150 between the rear portion of the graphite sheets 140 and a bottom surface of the mold frame 120, a surface on which the graphite sheets 140 are seated may be flattened, such that it is possible to prevent or substantially prevent a wrinkle of the graphite sheets 140 from being generated.

The back cover 160 is fastened to the mold frame 120 to accommodate the graphite sheets 140, the set components 130, and the mold frame 120.

Figure 13:
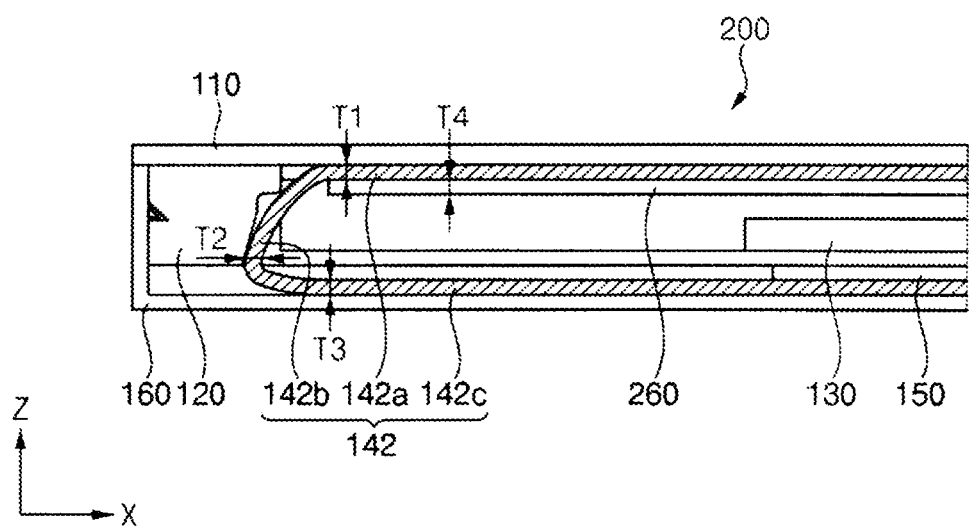
FIG. 13 is a cross-sectional view schematically illustrating a display device according to another embodiment of the present invention.

FIG. 13 is a cross-sectional view schematically illustrating a display device according to another embodiment of the present invention.

Referring to FIG. 13, the display device 200 according to another embodiment of the present invention includes a display panel 110, a mold frame 120, a set component 130, a graphite sheet 142, a cover plate 150, a graphite plate 260, and a back cover 160.

The display panel 110, the mold frame 120, the set components 130, the graphite sheet 142, the cover plate 150, and the back cover 160 may be substantially the same as the display panel 110, the mold frame 120, the set components 130, the graphite sheet 140, the cover plate 150, and the back cover 160 shown in FIG. 1 and FIG. 2. Thus, same or similar reference numerals are used in FIG. 13 to refer to components that are the same or similar to those shown in FIG. 1 and FIG. 2, and, thus, further detailed description thereof will be omitted.

The graphite sheets 142 include a front portion 142a, a curved portion 142b, and a rear portion 142c. The graphite sheets 142 may have a uniform thickness or may have different thicknesses. For example, a thickness T2 of the curved portion 142b may be configured to be thinner than a thickness T1 of the front portion 142a or a thickness T3 of the rear portion 142c for ease of bending. The graphite sheets 142 provide a heat dissipation path such that heat generated from the display panel 110 or heat generated from the set components 130 may be rapidly dissipated to an outside.

In an embodiment, the graphite plate 260 has a uniform thickness to be disposed between the display panel 110 and the graphite sheets 142. In the present embodiment, a thickness T4 of the graphite plate 260 may be greater than the thickness of the graphite sheet 142. For example, the thickness of the graphite plate 260 may be about 0.8 mm, and the thickness of the graphite sheet 142 may be about 0.2 mm. In the present embodiment, a material of the graphite plate 260 may be the same as a material of the graphite sheet 142. The graphite plate 260 may be formed as a single layer or multiple layers. In the present embodiment, the graphite plate 260 provides a path for dissipating heat reaching the graphite sheets 142.

Heat generated from the display panel 110 may reach the back cover 160 via the front portion 142a, the curved portion 142b, and the rear portion 142c of the graphite sheet 142 to be dissipated to the outside. In addition, heat generated from the set components 130 disposed in the mounting area reaches the back cover 160 via the front portion 142a, the curved portion 142b, and the rear portion 142c of the graphite sheet 142 to be dissipated to an outside.

Figure 14:
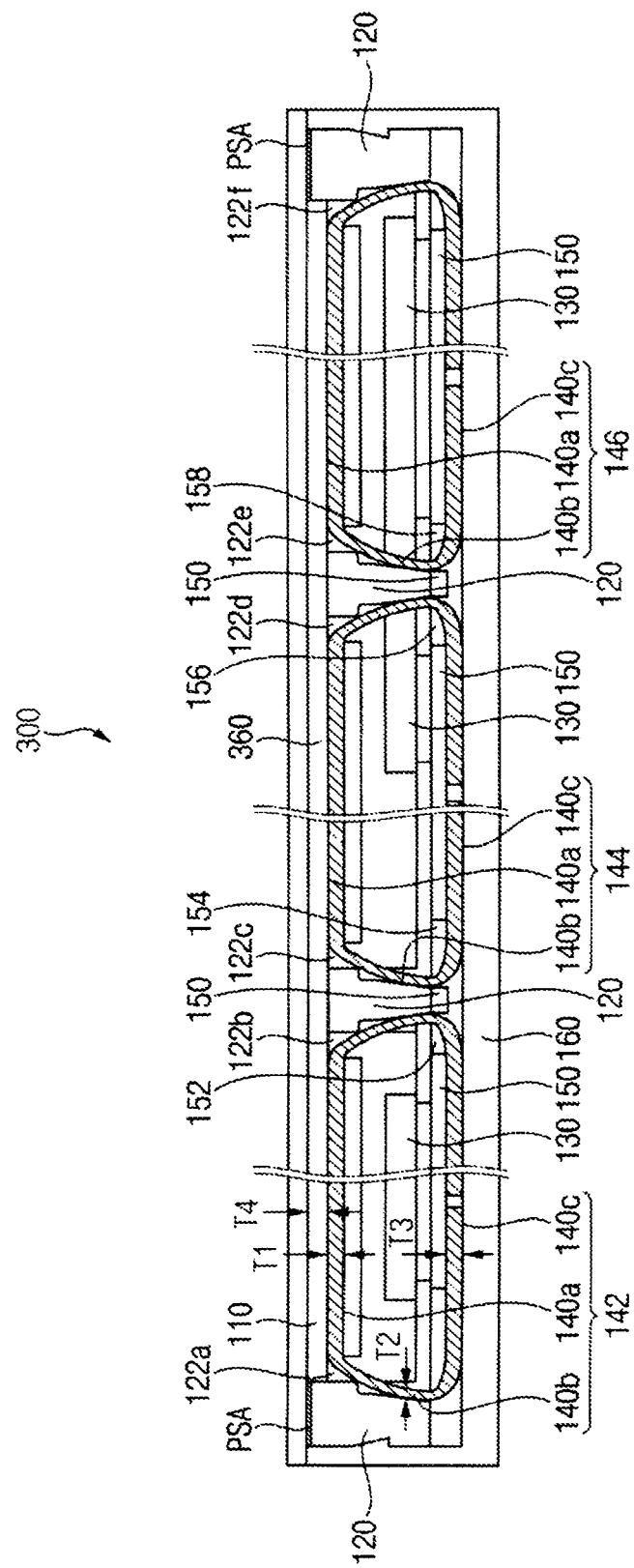
FIG. 14 is a cross-sectional view schematically illustrating a display device according to another embodiment of the present invention.

FIG. 14 is a cross-sectional view schematically illustrating a display device according to another embodiment of the present invention.

Referring to FIG. 14, a display device 300 according to another embodiment of the present invention includes a display panel 110, a mold frame 120, set components 130, a first graphite sheet 142, a second graphite sheet 144, a third graphite sheet 146, and a graphite plate 360.

The display panel 110, the mold frame 120, the set components 130, the first graphite sheet 142, the second graphite sheet 144, and the third graphite sheet 146 may be substantially the same as the display panel 110, the mold frame 120, the set components 130, the first graphite sheet 142, the second graphite sheet 144, and the third graphite sheet 146 described with respect to FIG. 1 to FIG. 3D. Thus, same reference numerals are used in FIG. 14 to refer to components that are the same or similar to those shown in FIG. 1 to FIG. 3D, and, thus, further detailed description thereof will be omitted.

In an embodiment, the graphite plate 360 has a uniform thickness to be disposed between the display panel 110 and the first to third graphite sheets 142, 144, and 146. In the present embodiment, the thickness T4 of the graphite plate 360 may be greater than the thicknesses T1, T2, and T3 of each of the first to third graphite sheets 142, 144, and 146. In the present embodiment, a material of the graphite plate 360 may be the same as a material of the first to third graphite sheets 142, 144, and 146. The graphite plate 360 may be formed as a single layer or multiple layers. In the present embodiment, the graphite plate 360 transfers heat output from the display panel 110 to the first to third graphite sheets 142, 144 and 146.

Figure 15:
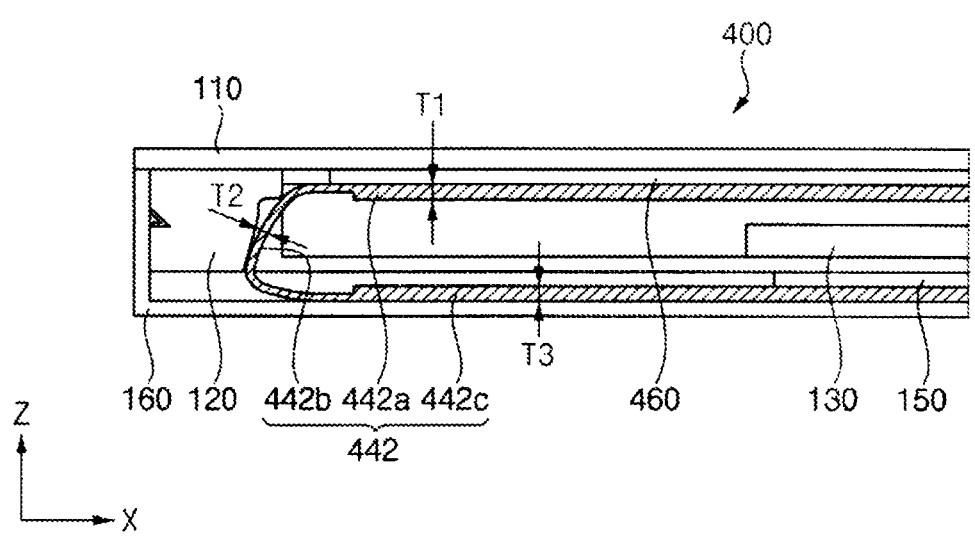
FIG. 15 is a cross-sectional view schematically illustrating a display device according to another embodiment of the present invention.

FIG. 15 is a cross-sectional view schematically illustrating a display device according to another embodiment of the present invention.

Referring to FIG. 15, a display device 400 according to another embodiment of the present invention includes a display panel 110, a mold frame 120, set components 130, a graphite sheet 442, a cover plate 150, a graphite plate 460, and a back cover 160.

The display panel 110, the mold frame 120, the set components 130, the cover plate 150, and the back cover 160 may be substantially the same as the display panel 110, the mold frame 120, the set components 130, the cover plate 150, and the back cover 160 described with respect to FIG. 1 and FIG. 2. Thus, same reference numerals are used in FIG. 15 to refer to components that are the same or similar to those shown in FIG. 1 and FIG. 2, and, thus, further detailed description thereof will be omitted.

The graphite sheets 442 include a front portion 442a, a curved portion 442b, and a rear portion 442c, and provide a heat dissipation path such that heat generated from the display panel 110 or heat generated from the set components 130 can be rapidly dissipated to an outside.

In particular, the front portion 442a is attached to a rear surface of the display panel 110 to be disposed on the set components 130. In an embodiment, the thickness T2 of the curved portion 442b may be thinner than the thickness T1 of the front portion 442a. The curved portion 442b is curved at the front portion 442a to pass the mold slot portion to be seated on the inner wall of the mold frame 120. In an embodiment, the thickness T3 of the rear portion 442c may be thicker than the thickness T2 of the curved portion 442b. The rear portion 442c extends from the curved portion 442b to be disposed parallel to a bottom surface of the mold frame 120. In the present embodiment, the curved portion 442b has a thickness thinner than that of the front portion 442a or the rear portion 442c, such that the curved portion 442b may be more easily seated on the mold guide formed on the outer wall or the inner wall of the mold frame 120.

In an embodiment, the graphite plate 460 has a uniform thickness to be disposed between the display panel 110 and the graphite sheets 442. For example, a thickness of the graphite plate 460 may be about 0.8 mm, a thickness of the front portion 442a or the rear portion 442c of the graphite sheet 442 may be about 0.2 mm, and a thickness of the curved portion 442b of the graphite sheet 442 may be about 0.1 mm.

Heat generated from the display panel 110 may reach the back cover 160 via the graphite plate 460, and the front portion 442a, the curved portion 442b, and the rear portion 442c of the graphite sheet 442, and then the heat is dissipated to an outside of the back cover 160. Heat generated from the set components 130 disposed in a mounting area may reach the back cover 160 via the front portion 442a, the curved portion 442b, and the rear portion 442c of the graphite sheet 442, and then the heat is dissipated to an outside of the back cover 160.

Figure 16:
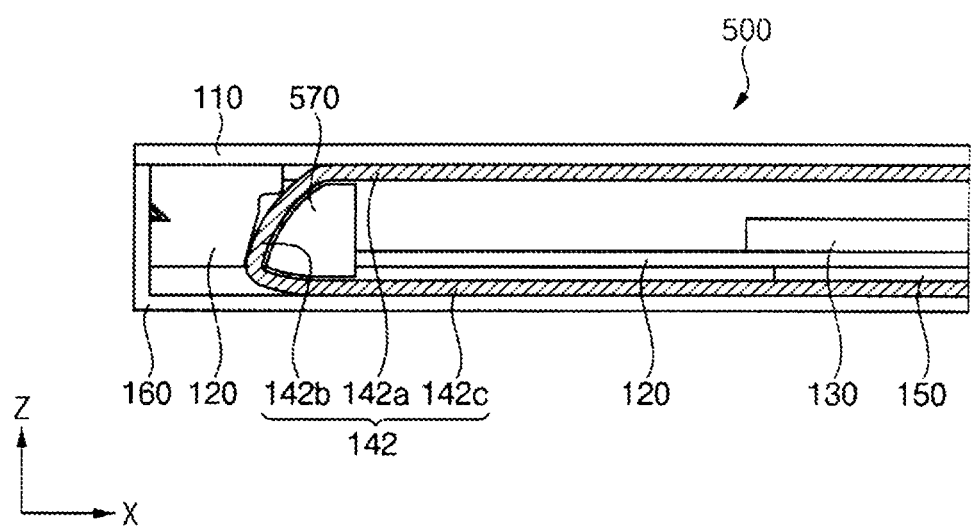
FIG. 16 is a cross-sectional view schematically illustrating a display device according to another embodiment of the present invention.

FIG. 16 is a cross-sectional view schematically illustrating a display device according to another embodiment of the present invention.

Referring to FIG. 16, a display device 500 according to another embodiment of the present invention includes a display panel 110, a mold frame 120, set components 130, a graphite sheet 142, a cover plate 150, an inner cushion foam 570, and a back cover 160.

The display panel 110, the mold frame 120, the set components 130, the graphite sheet 142, the cover plate 150, and the back cover 160 may be substantially the same as the display panel 110, the mold frame 120, the set components 130, the graphite sheet 142, the cover plate 150, and the back cover 160 described with respect to FIG. 1 and FIG. 2. Thus, same reference numerals are used in FIG. 16 to refer to components that are the same or similar to those shown in FIG. 1 and FIG. 2, and, thus, further detailed description thereof will be omitted.

In an embodiment, the inner cushion foam 570 is disposed so as to be surrounded by the curved portion 142b of the graphite sheet 142. Since the inner cushion foam 570 guides a curve of the graphite sheet 142, it is possible to prevent or substantially prevent the graphite sheet 142 from being damaged. Further, the inner cushion foam 570 may provide a cushioning effect to the graphite sheet 142, even if an external force is applied near the curved portion 142b of the graphite sheet 142. In FIG. 16, the inner cushion foam 570 may be disposed not only in the outermost area of the mold frame 120, but also in the inner area of the mold frame 120 so as to guide the curve of the graphite sheet 142.

Although the graphite sheet 142 having a uniform thickness is shown in FIG. 16, graphite sheets having different thicknesses may be disposed as shown in FIG. 15.

Heat generated from the display panel 110 reaches the back cover 160 through the front portion 142a, the curved portion 142b, and the rear portion 142c of the graphite sheet 142 to be dissipated to an outside.

Figure 17:
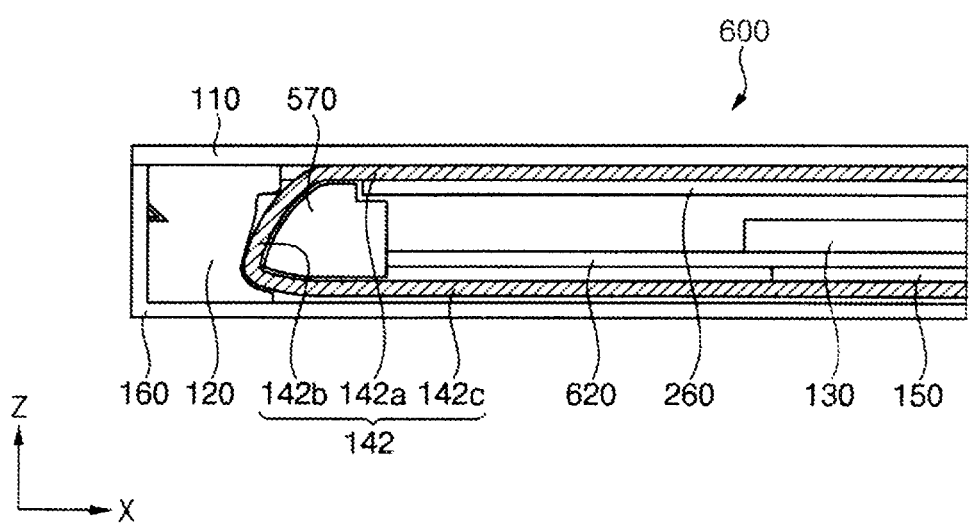
FIG. 17 is a cross-sectional view schematically illustrating a display device according to another embodiment of the present invention.

FIG. 17 is a cross-sectional view schematically illustrating a display device according to another embodiment of the present invention.

Referring to FIG. 17, a display device 600 according to another embodiment of the present invention includes a display panel 110, a mold frame 620, set components 130, a graphite sheet 142, a cover plate 150, an inner cushion foam 570, a graphite plate 260, and a back cover 160.

The display panel 110, the set components 130, the graphite sheet 142, the cover plate 150, and the back cover 160 may be substantially the same as the display panel 110, the set components 130, the graphite sheet 142, the cover plate 150, and the back cover 160 described with respect to FIG. 1 and FIG. 2. Thus, same reference numerals are used in FIG. 17 to refer to components that are the same or similar to those shown in FIG. 1 and FIG. 2, and, thus, further detailed description thereof will be omitted.

A mold guide may be formed on an outer wall or an inner wall of the mold frame 620 to guide the graphite sheets 142. Here, a surface of the mold guide is curved to correspond to the curved portion of the graphite sheet 142. For example, the middle portion of the mold guide is retracted or recessed relative to the upper portion and the lower portion of the mold guide such that the curved portion of the graphite sheet 142 is seated.

Since the inner cushion foam 570 is substantially the same as the inner cushion foam 570 described in FIG. 16, the same reference numerals are given and further detailed description thereof are omitted. Since the graphite plate 260 is substantially the same as the graphite plate 260 described in FIG. 13, the same reference numerals are given and further detailed descriptions thereof are omitted.

Although the graphite sheet 142 having a uniform thickness is shown in FIG. 17, graphite sheets having different thicknesses may be disposed as shown in FIG. 15.

Heat generated from the display panel 110 may reach the back cover 160 via the front portion 142a, the curved portion 142b, and the rear portion 142c of the graphite sheet 142 to be dissipated to an outside.

Figure 18:
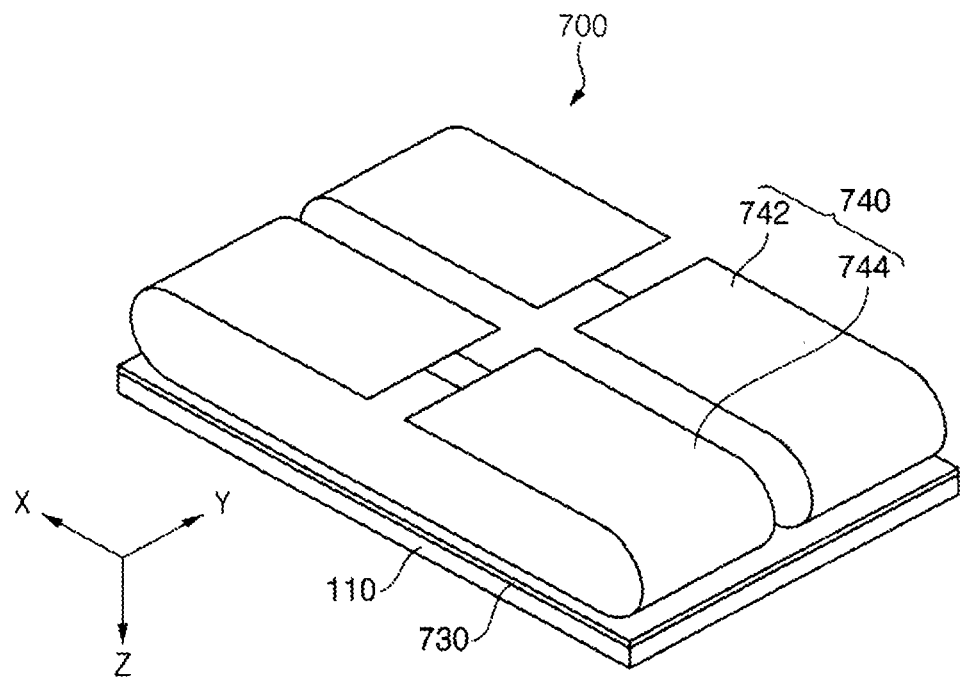
FIG. 18 is a rear view schematically illustrating a display device according to another embodiment of the present invention.

FIG. 18 is a rear view schematically illustrating a display device according to another embodiment of the present invention.

Referring to FIG. 18, a display device 700 according to another embodiment of the present invention includes a display panel 110, a mold frame, set components, a graphite plate 730, and graphite sheets 740. In the present embodiment, an illustration of the mold frame and the set components is omitted. In addition, since the display panel 110, the mold frame, and the set components may be the same as the display panel, the mold frame, and the set components described with respect to the previous embodiments, further detailed descriptions thereof will be omitted.

The graphite plate 730 is disposed between the display panel 110 and the graphite sheets 740 to transfer heat generated from the display panel 110 to the graphite sheets 740. In an embodiment, the graphite plate 730 is disposed to cover the entire display panel 110.

The graphite sheets 740 include a first graphite sheet 742 and a second graphite sheet 744. In an embodiment, the graphite sheets 740 are entirely attached to the rear surface of the graphite plate 730 parallel to the long side of the graphite plate 730.

The first graphite sheet 742 is disposed on a rear surface of the graphite plate 730, penetrates each of mold slots of the mold frame (not shown), and is disposed on an upper rear surface of the mold frame. That is, a front portion of the first graphite sheet 742 is attached to an upper rear surface of the graphite plate 730, a rear surface of the first graphite sheet 742 is disposed on an upper rear surface of the mold frame, and a curved portion of the first graphite sheet 742 is disposed in an inner space of the mold frame.

The second graphite sheet 744 is attached to a lower rear surface of the graphite plate 730, penetrates each of mold slots of the mold frame (not shown), and is disposed on a lower rear surface of the mold frame. That is, a front portion of the second graphite sheet 744 is attached to the lower rear surface of the graphite plate 730, a rear surface of the second graphite sheet 744 is disposed on a lower rear surface of the mold frame, and a curved portion of the second graphite sheet 744 is disposed in an inner space of the mold frame.

Figure 19:
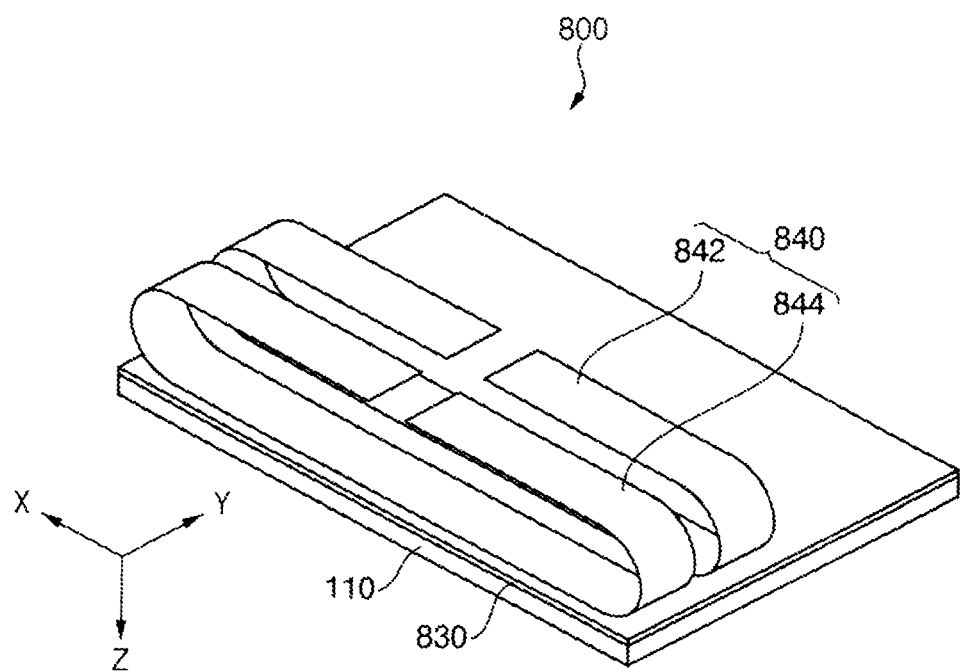
FIG. 19 is a rear view schematically illustrating a display device according to another embodiment of the present invention.

FIG. 19 is a rear view schematically illustrating a display device according to another embodiment of the present invention Referring to FIG. 19, a display device 800 according to another embodiment of the present invention includes a display panel 110, a mold frame, set components, a graphite plate 830, and graphite sheets 840. In the present embodiment, an illustration of the mold frame and the set components is omitted. In addition, since the display panel 110, the mold frame, and the set components may be the same as the display panel, the mold frame, and the set components described with respect to the previous embodiments, further detailed descriptions thereof will be omitted.

The graphite plate 830 is disposed between the display panel 110 and the graphite sheets 840 to transfer heat generated from the display panel 110 to the graphite sheets 840. In an embodiment, the graphite plate 830 is disposed to cover the display panel 110 as a whole.

The graphite sheets 840 include a first graphite sheet 842 and a second graphite sheet 844. In an embodiment, the graphite sheets 840 are attached to a rear surface of the graphite plate 830 so as to cover one half of the graphite plate 830 parallel to a long side of the graphite plate 830. In the present embodiment, when set components that can generate heat are disposed in a lower area of the display panel 110 (e.g., a half area of the display panel 110), the graphite sheets 840 may be disposed to cover one half of the display panel 110. For example, when the display device of the present invention is employed in a TV set, the graphite sheets 840 may be disposed on the graphite plate 830 so as to correspond to set components for a TV set that are conventionally disposed below.

The first graphite sheet 842 is attached to an upper rear surface of half of the graphite plate 830 parallel to a long side of the graphite plate 830. The first graphite sheet 842 penetrates through each of mold slots of the mold frame (not shown) to be disposed on an upper rear surface of half of the mold frame. That is, a front portion of the first graphite sheet 842 is attached to an upper rear surface of half of the graphite plate 830, a rear surface of the first graphite sheet 842 is disposed on an upper rear surface of half of the mold frame, and a curved portion of the first graphite sheet 842 is disposed in an inner space of the mold frame.

The second graphite sheet 844 is attached to a lower rear surface of half of the graphite plate 830. The second graphite sheet 844 penetrates through each of mold slots of the mold frame (not shown) to be disposed on a lower rear surface of half of the mold frame. That is, a front portion of the second graphite sheet 844 is attached to a lower rear surface of half of the graphite plate 830, a rear surface of the second graphite sheet 844 is disposed on a lower rear surface of half of the mold frame, and a curved portion of the second graphite sheet 844 is disposed in an inner space of the mold frame.

Figure 20:
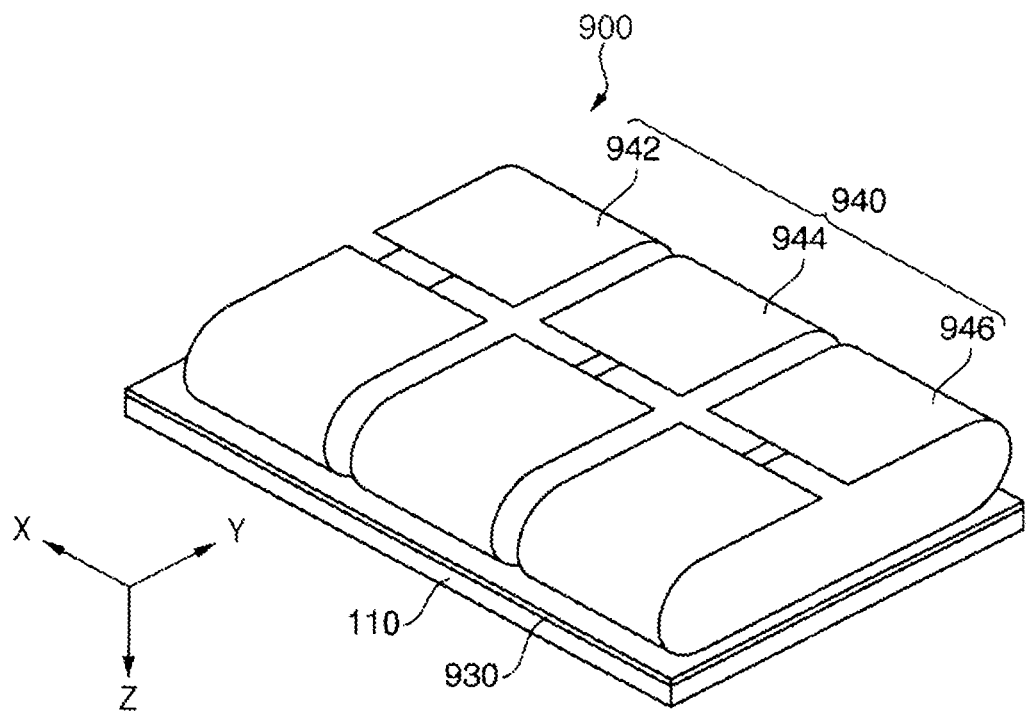
FIG. 20 is a rear view schematically illustrating a display device according to another embodiment of the present invention.

FIG. 20 is a rear view schematically illustrating a display device according to another embodiment of the present invention.

Referring to FIG. 20, a display device 900 according to still another embodiment of the present invention includes a display panel 110, a mold frame, set components, a graphite plate 930, and graphite sheets 940. In the present embodiment, an illustration of the mold frame and the set components is omitted. In addition, since the display panel 110, the mold frame, and the set components may be the same as the display panel, the mold frame, and the set components described with respect to the previous embodiments, further detailed descriptions thereof will be omitted.

The graphite plate 930 is disposed between the display panel 110 and the graphite sheets 940 to transfer heat generated from the display panel 110 to the graphite sheets 940. In an embodiment, the graphite plate 930 is disposed to cover the entire display panel 110.

The graphite sheets 940 include a first graphite sheet 942, a second graphite sheet 944, and a third graphite sheet 946. In an embodiment, the graphite sheets 940 are attached to a rear surface of the graphite plate 930 so as to be parallel to a short side of the graphite plate 930 and cover the graphite plate 930 as a whole.

The first to third graphite sheets 942, 944, and 946 are attached to a rear surface of the graphite plate 930 in parallel to a short side of the graphite plate 930. The first to third graphite sheets 942, 944, and 946 are disposed on a rear surface of the mold frame (not shown) through each of mold slots of the mold frame. That is, from the viewpoint of an observer, a front portion of the first graphite sheet 942 is attached to a left rear surface of the graphite plate 930, a rear surface of the first graphite sheet 942 is disposed on a left rear surface of the mold frame, and a curved portion of the first graphite sheet 942 is disposed in an inner space of the mold frame.

From an observer's point of view, a front portion of the second graphite sheet 944 is attached to a middle rear surface of the graphite plate 930, a rear portion of the second graphite sheet 944 is disposed on a middle rear surface of the mold frame, and a curved portion of the second graphite sheet 944 is disposed in an inner space of the mold frame.

From an observer's point of view, a front portion of the third graphite sheet 946 is attached to a right rear surface of the graphite plate 930, a rear portion of the third graphite sheet 946 is disposed on a right rear surface of the mold frame, and a curved portion of the third graphite sheet 946 is disposed in an inner space of the mold frame.

Figure 21:
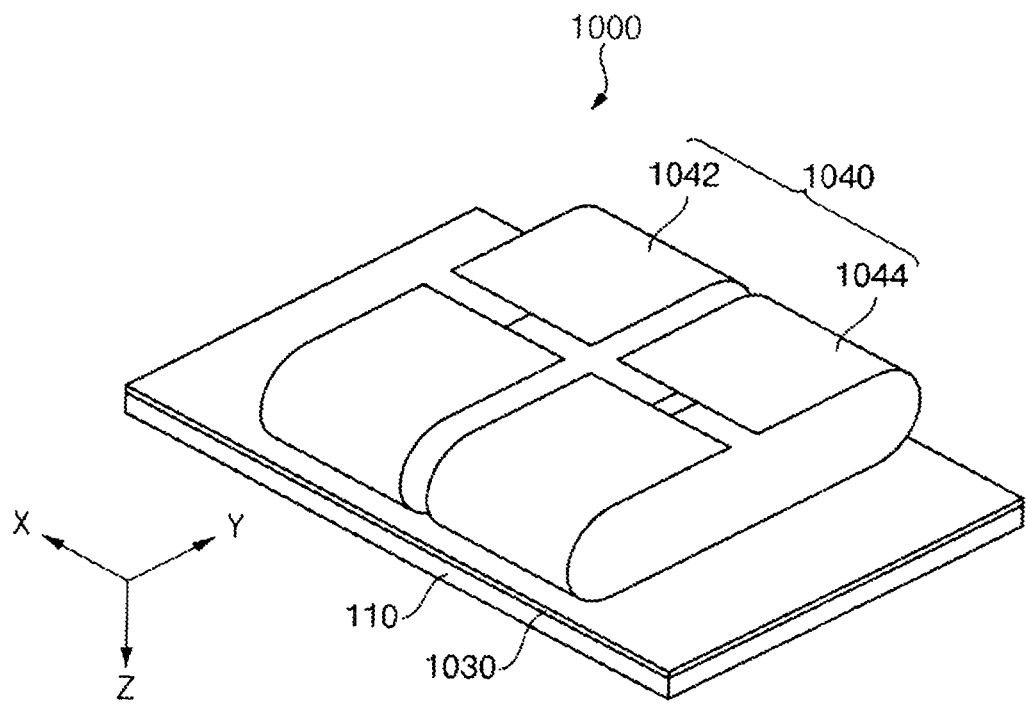
FIG. 21 is a rear view schematically illustrating a display device according to another embodiment of the present invention.

FIG. 21 is a rear view schematically illustrating a display device according to another embodiment of the present invention.

Referring to FIG. 21, a display device 1000 according to another embodiment of the present invention includes a display panel 110, a mold frame, set components, a graphite plate 1030, and graphite sheets 1040. In the present embodiment, an illustration of the mold frame and the set components is omitted. In addition, since the display panel 110, the mold frame, and the set components may be the same as the display panel, the mold frame, and the set components described with respect to the previous embodiments, further detailed descriptions thereof will be omitted.

The graphite plate 1030 is disposed between the display panel 110 and the graphite sheets 1040 to transfer heat generated from the display panel 110 to the graphite sheets 1040. The graphite plate 1030 is disposed to entirely cover the display panel 110.

The graphite sheets 1040 include a first graphite sheet 1042 and a second graphite sheet 1044. In an embodiment, the graphite sheets 1040 are disposed on a rear surface of the graphite plate 1030 to partially cover the graphite plate 1030 in parallel to a short side of the graphite plate 1030.

The first and second graphite sheets 1042 and 1044 are attached to a rear surface of the graphite plate 1030 parallel to a short side of the graphite plate 1030. The first and second graphite sheets 1042 and 1044 pass through each of the mold slots of the mold frame (not shown) to be disposed on a rear surface of the mold frame. That is, when viewed from a plan view, a front portion of the first graphite sheet 1042 is attached to a rear surface of one side of a central portion of the graphite plate 1030, a rear portion of the first graphite sheet 1042 is disposed on a rear surface of the central portion of the mold frame, and a curved portion of the first graphite sheet 1042 is disposed in an inner space of the mold frame.

When viewed from a plan view, a front portion of the second graphite sheet 1044 is attached to a rear surface of another side of the central portion of the graphite plate 1030, a rear portion of the second graphite sheet 1044 is disposed on another rear surface of the central portion of the mold frame, and a curved portion of the second graphite sheet 1044 is disposed in an inner space of the mold frame.

As described above, according to embodiments of the present invention, the graphite sheet is rolled and disposed in a mounting space between the display panel and the back cover, such that heat generated from the display panel may be dissipated to the outside via the graphite sheet and the back cover.

That is, a front portion of the graphite sheet is disposed on a rear surface of the display panel, a curved portion of the graphite sheet is seated on an outer wall or an inner wall of a mold frame, and a rear portion of the graphite sheet is disposed between the mold frame and the back cover, such that heat generated from the display panel may reach the back cover via the front portion, the curved portion, and the rear portion to be dissipated to the outside.

Having described some embodiments of the present invention, it is further noted that it will be readily apparent to those of ordinary skill in the art that various modifications may be made without departing from the spirit and scope of the invention which is set forth by the metes and bounds of the appended claims.

What is claimed is:

1. A display device comprising:
 a display panel;
 a mold frame comprising a mold slot portion including at least one mold slot through the mold frame to support the display panel; and
 graphite sheets, each comprising a respective central portion on a rear surface of the display panel, and respective end portions each passing through a mold slot of the at least one mold slot to be on a rear surface of the mold frame.

2. The display device of claim 1, further comprising a cover plate between a rear surface of the graphite sheets and the rear surface of the mold frame.

3. The display device of claim 1, further comprising a back cover fastened to the mold frame to receive the graphite sheets and the mold frame.

4. The display device of claim 1, further comprising a graphite plate on the rear surface of the display panel.

5. The display device of claim 4, wherein the graphite plate is between the display panel and the graphite sheets.

6. The display device of claim 4, wherein the graphite plate is surrounded by the graphite sheets.

7. The display device of claim 1, wherein each of the graphite sheets comprises the central portion comprising a front portion on the rear surface of the display panel, and the end portions, each comprising a curved portion curved at the front portion and penetrating the mold slot portion to be seated in an inner space of the mold frame, and a rear portion extending from the curved portion and arranged parallel to the rear surface of the mold frame.

8. The display device of claim 7, wherein a thickness of the curved portion is thinner than a thickness of the front portion.

9. The display device of claim 8, further comprising an inner cushion foam arranged to be surrounded by the curved portion.

10. The display device of claim 7, wherein a mold guide is arranged on an outer wall or an inner wall of the mold frame to guide a graphite sheet of the graphite sheets.

11. The display device of claim 10, wherein a surface of the mold guide is curved corresponding to the curved portion of the graphite sheet of the graphite sheets.

12. The display device of claim 10, wherein a middle portion and a lower portion of a surface of the mold guide are recessed relative to an upper portion of the surface of the mold guide such that the curved portion of the graphite sheet of the graphite sheets is seated.

13. The display device of claim 10, wherein a middle portion of a surface of the mold guide is recessed relative to an upper portion and a lower portion of the surface of the mold guide such that the curved portion of the graphite sheet of the graphite sheets is seated.

14. The display device of claim 1, further comprising set components mounted on a lower inner side of the mold frame,
 wherein the set components comprise a power supply, an analog-digital board, and a speaker.

15. The display device of claim 1, wherein the graphite sheets comprise:
 a first graphite sheet arranged in parallel along a long side of the display panel; and
 a second graphite sheet arranged in parallel along the long side of the display panel,
 wherein the at least one mold slot comprises a first mold slot through which a side of the first graphite sheet penetrates, a second mold slot through which another side of the first graphite sheet penetrates, a third mold slot through which a side of the second graphite sheet penetrates, and a fourth mold slot through which another side of the second graphite sheet penetrates.

16. The display device of claim 15, wherein the first graphite sheet and the second graphite sheet entirely cover the display panel.

17. The display device of claim 15, wherein the first graphite sheet and the second graphite sheet cover half of the display panel.

18. The display device of claim 1, wherein the graphite sheets comprise:
 a first graphite sheet arranged in parallel along a short side of the display panel;
 a second graphite sheet arranged in parallel along the short side of the display panel; and
 a third graphite sheet arranged in parallel along the short side of the display panel,
 wherein the at least one mold slot comprises a first mold slot through which a side of the first graphite sheet penetrates, a second mold slot through which another side of the first graphite sheet penetrates, a third mold slot through which a side of the second graphite sheet penetrates, a fourth mold slot through which another side of the second graphite sheet penetrates, a fifth mold slot through which a side of the third graphite sheet penetrates, and a sixth mold slot through which another side of the third graphite sheet penetrates.

19. The display device of claim 1, wherein the graphite sheets comprise:
  a first graphite sheet arranged in parallel along a short side of the display panel; and
  a second graphite sheet arranged in parallel along the short side of the display panel,
  wherein the at least one mold slot comprises a first mold slot through which a side of the first graphite sheet penetrates, a second mold slot through which another side of the first graphite sheet penetrates, a third mold slot through which a side of the second graphite sheet penetrates, and a fourth mold slot through which another side of the second graphite sheet penetrates.

20. The display device of claim 1, wherein the graphite sheets are located along a side of the display panel and inserted into the mold slot portion, and the mold slot portion is parallel to a side of the mold frame.

\* \* \* \* \*